(12) United States Patent
Langer et al.

(10) Patent No.: US 9,425,742 B2
(45) Date of Patent: Aug. 23, 2016

(54) METHOD AND APPARATUS FOR CORRECTING INCONVENIENT POWER AMPLIFIER LOAD CHARACTERISTICS IN AN ENVELOPE TRACKING BASED SYSTEM

(71) Applicant: Intel Corporation, Santa Clara, CA (US)

(72) Inventors: Andreas Langer, Lohhof (DE); Simon Hughes, Lake Zurich, IL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/565,617

(22) Filed: Dec. 10, 2014

(65) Prior Publication Data

US 2016/0173030 A1   Jun. 16, 2016

(51) Int. Cl.
*H03F 3/191* (2006.01)
*H03F 1/02* (2006.01)
*H03F 3/19* (2006.01)
*H03F 3/21* (2006.01)

(52) U.S. Cl.
CPC .............. *H03F 1/0205* (2013.01); *H03F 3/19* (2013.01); *H03F 3/21* (2013.01); *H03F 2200/102* (2013.01); *H03F 2200/451* (2013.01)

(58) Field of Classification Search
CPC ................................. H03F 3/191; H03G 3/20
USPC ................................. 330/305, 302, 129, 136
See application file for complete search history.

(56) References Cited

U.S. PATENT DOCUMENTS

| 6,349,216 | B1 | 2/2002 | Alberth, Jr. et al. | |
| 7,893,763 | B2* | 2/2011 | Andrews | H03F 1/02 330/129 |
| 8,041,315 | B2* | 10/2011 | Hamalainen | H03F 1/0205 330/129 |
| 2007/0057728 | A1 | 3/2007 | Autti | |
| 2007/0184793 | A1 | 8/2007 | Drogi et al. | |
| 2012/0105147 | A1 | 5/2012 | Harris et al. | |
| 2015/0236877 | A1* | 8/2015 | Peng | H04L 25/08 375/297 |

OTHER PUBLICATIONS

European Search Report, Application No. 15193954.3-1805, Dated Apr. 12, 2016.

* cited by examiner

*Primary Examiner* — Henry Choe

(74) *Attorney, Agent, or Firm* — Eschweiler & Associates, LLC

(57) ABSTRACT

A tunable matching network is configured to couple at least one filter with a power amplifier that is configured to operate in an envelope tracking (ET) mode of operation over a transmit band. A control component is configured to detect a present set of operating conditions of the power amplifier when the power amplifier operates in the ET mode of operation. The present set of operating conditions comprises a present frequency of operation, and the control component is further configured to transmit a control signal to the tunable matching network in response to the detected present set of operating conditions. The tunable matching network is further configured to adjust an impedance of the tunable matching network in response to the transmitted control signal such that one or more ET characteristics are optimized based at least in part on the present set of operating conditions.

20 Claims, 15 Drawing Sheets

METHOD AND APPARATUS FOR CORRECTING INCONVENIENT POWER AMPLIFIER LOAD CHARACTERISTICS IN AN ENVELOPE TRACKING BASED SYSTEM

FIELD

The present disclosure relates to envelope tracking, and more specifically, to optimizing envelope tracking characteristics by optimizing power amplifier (PA) load characteristics.

BACKGROUND

An efficient way to optimize the PA current consumption in a wireless system across the entire output power range is the use of a DC-DC converter to provide a variable PA supply voltage to a PA. Depending on the RF output power, for example, the output voltage of the DC-DC converter to the PA is adjusted. As the output power lowers, the PA supply voltage to the PA also lowers as a result. Due to a voltage conversion from the battery voltage down to the lower PA supply voltage, the battery current is reduced. Alternatively, the DC-DC converter output voltage can be fixed based on the target RF power (average RF power), which is expected in a next period of time. This procedure is sometimes called average power tracking (APT), in which a constant voltage is supplied to the PA.

Envelope tracking DC-DC (ET DC-DC) converters or envelope tracking modulators are capable of envelope tracking to further reduce the battery current. Envelope tracking describes an approach to RF amplifier operation, for example, in which the power supply voltage applied to the power amplifier is constantly adjusted to ensure that the amplifier is operating at or close to peak efficiency for the given instantaneous output power requirements.

A feature of envelope tracking is that the supply voltage of the power amplifier is not constant. The supply voltage of the power amplifier depends on the instantaneous envelope of the modulated baseband signal or radio frequency (RF) input signal, which is input into the PA. For example, an ET DC-DC converter follows the instantaneous envelope of the RF signal, which removes the voltage headroom and further increases the system efficiency (composite efficiency of the power amplifier and the DC-DC converter). An ET DC-DC converter, for example, can reduce the battery current of a Long Term Evolution (LTE) signal by roughly 20+% at maximum output power relative to a standard DC-DC converter, which simply follows an average power or a constant power supply.

DETAILED DESCRIPTION

Figure 1:
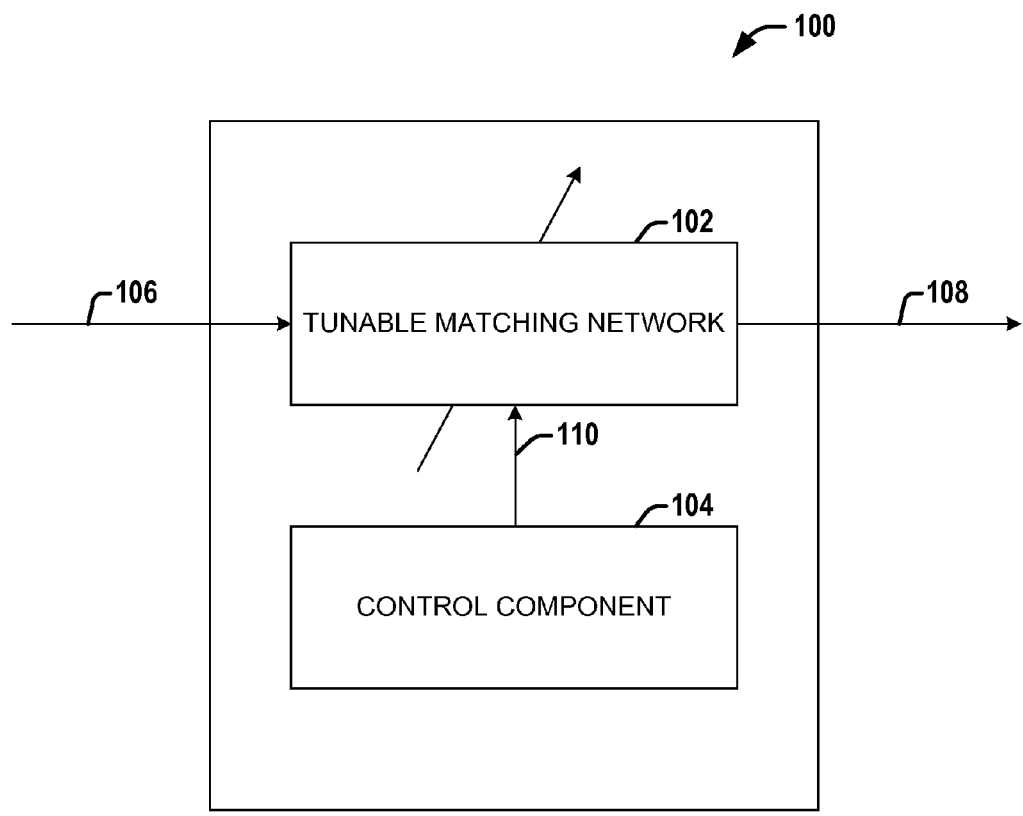
FIG. 1 is a block diagram illustrating a system or device that facilitates envelope tracking (ET) according to various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

One significant challenge of envelope tracking (ET) is a tight time synchronization of the radio frequency (RF) envelope and the instantaneous power amplifier (PA) supply voltage, which is a function of the instantaneous RF envelope. For example, for long term evolution frequency band 20 (LTE-20), the delay accuracy is about 1 ns. If the delay accuracy is violated, the adjacent channel leakage ratio (ACLR) performance is degraded and memory effects are introduced in the transmit chain.

The delay between the RF envelope and the instantaneous PA supply voltage depends on many contributions, for example, delay in the RF signal path, delay in the ET signal path, delay in the ET DC-DC converter (or tracker), etc. These contributions can be captured by factory calibration to account for sample variations and temperature compensation to account for a delay drift over temperature.

The delay between the RF envelope and the instantaneous PA supply voltage is referred to herein as "ET delay." The ET delay is distinct from the RF group delay, which is caused by a frequency dependent phase shift, $\sim\Delta(\text{phase})/\Delta(\text{frequency})$, introducing an offset delay in the RF envelope.

The interaction between a filter (for example, the transmit filter of a duplexer) and the PA has a significant impact on PA behavior in an ET system. A duplexer is essentially an implementation of multiple filters: at least one receive (RX) filter and at least one transmit (TX) filter combined by means of a phase shifter. Each of these filters can include multiple resonators to achieve the appropriate filter characteristics.

However, if the PA is loaded by a duplexer or similar element (e.g., a bandpass filter employed in conjunction with a time division duplexing (TDD) transmission mode, etc.) providing a load impedance with a rapidly changing phase and magnitude across frequency, multiple ET characteristics are impacted. For example, the ET delay and gain will depend on transmit frequency, and amplitude-to-amplitude distortion (AMAM) and amplitude-to-phase distortion (AMPM) response will be clouded, meaning that the AMAM and AMPM responses will be split into multiple responses, depending on the instantaneous frequency of the envelope. It is also possible for these ET characteristics (e.g., ET delay, etc.) to change within the modulation bandwidth, which causes ACLR degradation that cannot be easily corrected by conventional methods and apparatuses.

Frequency dependent ET delay is also referred to herein as ET delay dispersion or ET delay variation over frequency (similarly, frequency dependent gain is also referred to herein as gain dispersion or gain variation over frequency). ET delay dispersion is caused by a harmful interaction between the ET system (which can include a PA and ET DC-to-DC converter) and at least one coupled filter (e.g., a TX filter of a duplexer, etc.). The impact of the at least one coupled filter (e.g., a TX filter of a duplexer, etc.) on multiple ET characteristics (e.g., ET delay dispersion, gain dispersion, AMAM and AMPM response clouding, ACLR, etc.) is a fundamental effect in ET, which has not been anticipated by conventional ET methods and apparatuses, yet can impede further ET development. Additionally, ET characteristics can be affected by other operating conditions (e.g., temperature; proximity of user, other materials, etc. to an antenna, etc.; etc.) in ways conventional ET techniques do not address.

Some user equipment employs a PA with an integrated duplexer (a PAD module). To some extent, inclusion of a PAD model can mitigate the negative impact of the duplexer on ET characteristics, but in a more expensive and less effective manner than aspects described herein. The integration of the duplexer allows the PAD manufacturer to optimize the interface between PA and duplexer with respect to ET performance. However, conventional optimization is a time consuming task requiring a deep understanding of the interaction between the PA and the duplexer. Because of the cost, PAD modules are only employed in high-end user equipment.

Additionally, many user equipment manufacturers (e.g., for lower-cost user equipment, etc.) typically employ external, discrete duplexers to minimize cost, as duplexers are a major cost driver in user equipment (in a multiband device, the number of duplexers increases with the number of supported bands, and can easily exceed the price for RF transceiver and PA). However, when a discrete duplexer is employed in an ET application, unless the interface between duplexer and PA is optimized, the performance of the ET system (e.g., in terms of current consumption, ACLR, etc.) will be degraded, and may not be superior to alternatives (e.g., APT). This optimization can be done via a matching network on the printed circuit board (PCB). However, as discussed above, conventional optimization can be time consuming and requires a deep understanding of the ET system.

Additionally, conventional optimization techniques optimize the PA and duplexer interface initially, and apply that same static matching under all operating conditions, for example, over the entire transmit band. Because of this, while performance under some operating conditions (e.g., some portions of the transmit band, temperatures, etc.) may be acceptable, ET characteristics can be degraded under other operating conditions (e.g., other portions of the transmit band, temperatures, etc.). The degraded ET characteristics become even more pronounced in wideband communication modes.

Systems, methods, and apparatuses discussed herein can facilitate envelope tracking by optimizing an interface between a PA and at least one filter based on a set of present operating conditions (which can include, e.g., one or more of a present operating frequency, present temperature, etc.).

Referring to FIG. 1, illustrated is a block diagram of a system 100 that facilitates envelope tracking (ET) according to various aspects described herein. System 100 includes a tunable matching network 102 and a control component 104. Tunable matching network 102 can include an inductive element and an adjustable or tunable capacitive element, for example, a switched capacitor network including a plurality of switchable capacitors, or one or more varactors, etc. Tunable matching network 102 can couple, via an input 106, a PA capable of operating in an ET mode, with at least one filter, via an output 108. Alternatively, tunable matching network 102 can be coupled to the PA and the at least one filter by being inserted in the transmit path after the at least one filter, and instead couple, via input 106, to the at least one filter. Either embodiment can alter PA load characteristics as described herein. Similarly, although the embodiments illustrated and discussed in connection with FIGS. 2-8 and 15 have tunable matching network 102 or 1517 between the PA and the at least one filter in the transmit path, alternative embodiments may be employed wherein the tunable matching network 102 or 1517 is arranged after the at least one filter in the transmit path.

Control component 104 can detect a present set of operating conditions of the PA coupled to tunable matching network 102. The present set of operating conditions can include a present frequency or frequencies of operation, temperature, or other factors affecting impedance matching between the PA and the at least one filter, including conditions affecting a target PA load or an input impedance of the at least one filter (e.g., touching an antenna, etc.). Based on the present set of operating conditions, control component 104 determines an impedance of tunable matching network 102 that optimizes one or more ET characteristics, which can include ET delay variation over frequency (ET delay dispersion), gain variation over frequency (gain dispersion), AMAM and AMPM response clouding, ACLR, etc.

Based on the determined impedance, control component 104 can transmit a control signal (e.g., control word, etc.) 110 to tunable matching network 102. In response to receiving the control signal 110, tunable matching network 102 can adjust an impedance thereof to match the determined impedance. At the determined impedance, tunable matching network 102 maps an input impedance of the at least one filter (e.g., a transmit filter of a duplexer in frequency division duplexing (FDD) embodiments, a bandpass filter in time division duplexing (TDD) embodiments, etc.) to a target PA load impedance to optimize the one or more ET characteristics, such as by minimizing the phase or amplitude variation over frequency, depending on the magnitude of the reflected signal resulting from mismatch between the PA and at least one filter. The higher the magnitude of the reflected signal is, the lower the tolerable phase or amplitude change of the reflected signal over frequency will be. Minimizing the phase or amplitude variation over frequency can be achieved either by minimizing the reflection (if there is almost no reflection, the phase change over frequency of the reflected signal will not matter) or by minimizing the changes of phase or amplitude over frequency. In aspects described herein, depending on a set of present operating conditions, an impedance of the tunable matching network can be changed to minimize this phase or amplitude variation over frequency. In contrast, in conventional systems with a static match, it is difficult or even impossible to match the complex input impedance of a filter with multiple resonances over a wider frequency range.

In general, the determined impedance of tunable matching network 102 is different than a conventional state that would optimize efficiency or linearity of PA performance by itself, or PA performance when operating in a non-ET mode. However, by optimizing the one or more ET characteristics, the determined state can provide for greater overall efficiency, due to the improved efficiency gains from the ET mode when operating with the one or more ET characteristics optimized. For example, by optimizing an ET delay variation over frequency for a present range of frequencies (or other conditions) the PA is operating in (e.g., by making the ET delay dispersion flat or linear for the present set of operating conditions), providing for tracking with a better linearity characteristic (e.g., improved adjacent channel leakage ratio (ACLR), etc.), maximizing the efficiency gains from ET, and increasing the overall efficiency of the combination. In contrast, without optimization as discussed herein, if the ET delay has an offset relative the optimum delay or shows strong variation over the modulation bandwidth, then the quality of the tracking will be degraded causing, for example, higher ACLR values, up to levels violating 3GPP (third generation partnership project) specifications. Although, in some aspects, ET optimized matching as described herein might degrade the peak efficiency of the power amplifier, it will improve the linearity characteristic of the ET system, resulting in better ACLR, etc. Since the PA still operates close to its peak efficiency, but can effectively operate in an ET mode over the entire transmit band, there will be gains in system efficiency compared to a PA operating in APT mode with a lot of headroom relative to its saturated power, FIG. 11, discussed in greater detail below, shows an example ET delay as a function of frequency before optimization according to aspects discussed herein (the gray data points and line graph), and after optimization according to aspects discussed herein (the black solid and dashed line segments). As can be clearly seen in FIG. 11, after optimization, the optimum ET delay over frequency both has a smaller variance than before optimization and is linear over each of the indicated sub-bands.

Figure 12:
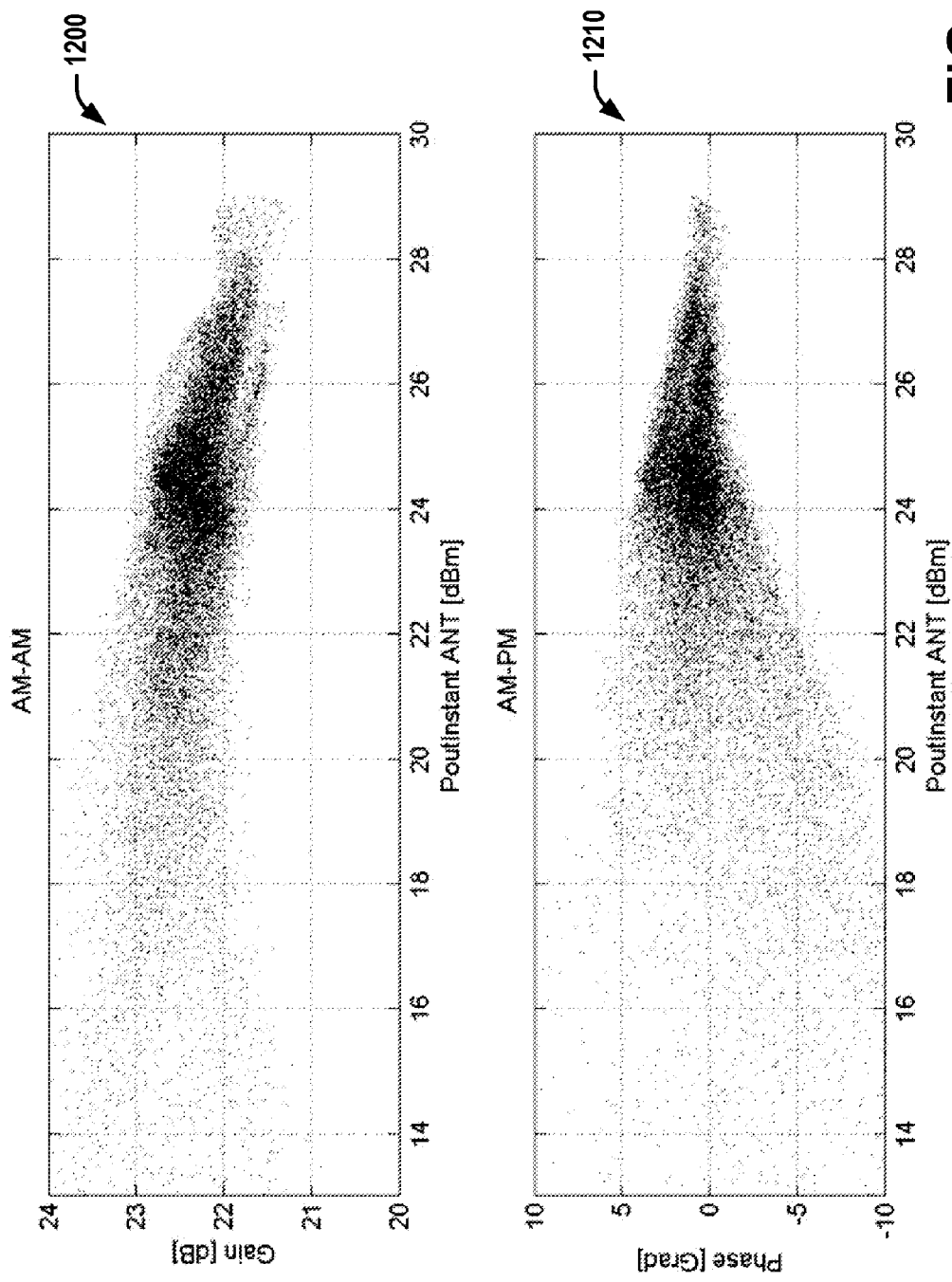
FIG. 12 is a graph illustrating amplitude-to-amplitude distortion (AMAM) and amplitude-to-phase distortion (AMPM) response clouding at 887 MHz without optimization according to various aspects described herein.
Figure 13:
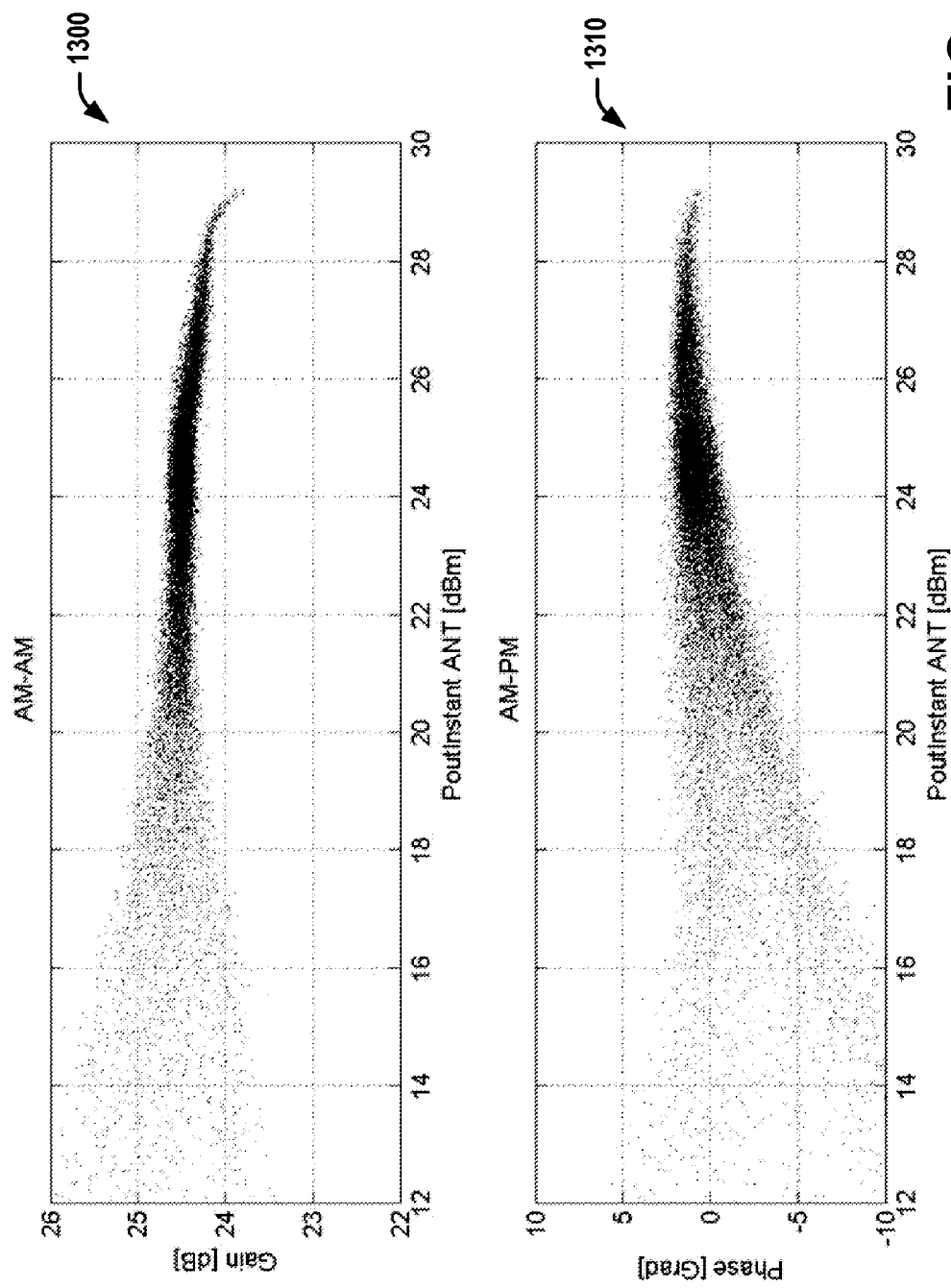
FIG. 13 is a graph illustrating AMAM and AMPM response with reduced clouding at 911 MHz with optimization according to various aspects described herein.

In connection with other example ET characteristics, a strong gain change over frequency or high gain gradient (e.g., 1 dB per 5 MHz, etc.) indicates PA pulling due to filter impedance (e.g., the transmit filter of a duplexer, etc.). This will cause a memory effect in a wideband signal, which is visible as clouding of the AMAM and AMPM response. Increased AMAM and AMPM response clouding can cause an asymmetric ACLR characteristic, increased bit error rate in digital signals or signal degradation in analog signals. Thus by optimizing the gain variation over frequency (e.g., by making the gain dispersion flat or linear for the present set of operating conditions) or AMAM and AMPM response clouding over frequency (e.g., by tightening clouding, e.g., to less than 1 dB opening, etc.), memory effects can be reduced and performance improved (e.g., lower bit error rate, etc.). FIG. 12 and FIG. 13, discussed in greater detail below, show examples of AMAM and AMPM response clouding without optimization as discussed herein (in FIG. 12) and with optimization as discussed herein (in FIG. 13). As can be seen from a comparison of FIG. 12 with FIG. 13, optimization as discussed herein can substantially improve AMAM and AMPM response clouding.

As the set of present operating conditions changes, the impedance that optimizes the one or more ET characteristics can potentially change, as well. By providing a tunable matching filter 102 that can adjust its impedance based on a set of present operating conditions (as detected by control component 104 and in response to control signal 110), system 100 can optimize the one or more ET characteristics over the range of possible operating conditions (e.g., over an entire transmit band of the PA, etc.), in contrast to conventional systems.

In aspects, the transmit band of the PA can be divided into two or more sub-bands, such that each sub-band of the two or more sub-bands can be associated with a distinct impedance of the tunable matching network 102 that optimizes the one or more ET characteristics over the sub-band. In such aspects, upon control component 104 detecting PA operation within or substantially within (e.g., greater than 50%, etc.) a first sub-band of the two or more sub-bands, control component 104 can transmit a first control signal, and tunable matching network 102 can adjust its impedance to a first impedance that optimizes the one or more ET characteristics over the first sub-band. Likewise, upon control component 104 detecting PA operation within or substantially within a second sub-band of the two or more sub-bands, control component 104 can transmit a second control signal, and tunable matching network 102 can adjust its impedance to a second impedance that optimizes the one or more ET characteristics over the second sub-band. In aspects, additional sub-bands, control signals, and impedances can also be employed in a similar manner (e.g., third, fourth, etc.).

The size of each sub-band (and, in aspects, the number of sub-bands) can be determined based on how the input impedance of the at least one filter changes as a function of frequency, and thus how the one or more ET characteristics change over frequency. Because each of the at least one filters includes one or more resonators, filter input impedance will change over frequency, and ET characteristics (e.g., ET delay, etc.) will change more rapidly in some frequency ranges than others. In frequency ranges where ET characteristics change more rapidly, smaller sub-bands can be used to improve optimization in these frequency ranges. In aspects, either or both of the sizes and the center frequencies of sub-bands can be selected based at least in part on how the one or more ET characteristics vary based on frequency. In further aspects, the number of sub-bands can also be selected based at least in part on how the one or more ET characteristics vary based on frequency.

System 100 (and other systems and devices discussed herein that facilitate ET) can be employed with any of a variety of user equipment, components, or communication standards, such as with any PA technology (e.g., GaAs, CMOS (complementary metal-oxide-semiconductor), SOI (silicon on insulator), etc.), with various configurations of components (e.g., separate PA and filter(s), PAD module, duplexer separate from or integrated with antenna, etc.), in single-band or multi-band and/or multi-mode configurations, or with any communication standards or protocols (e.g., FDD or TDD, any wireless standard such as 3G, CDMA (code division multiple access), LTE (long term evolution), etc.).

Figure 2:
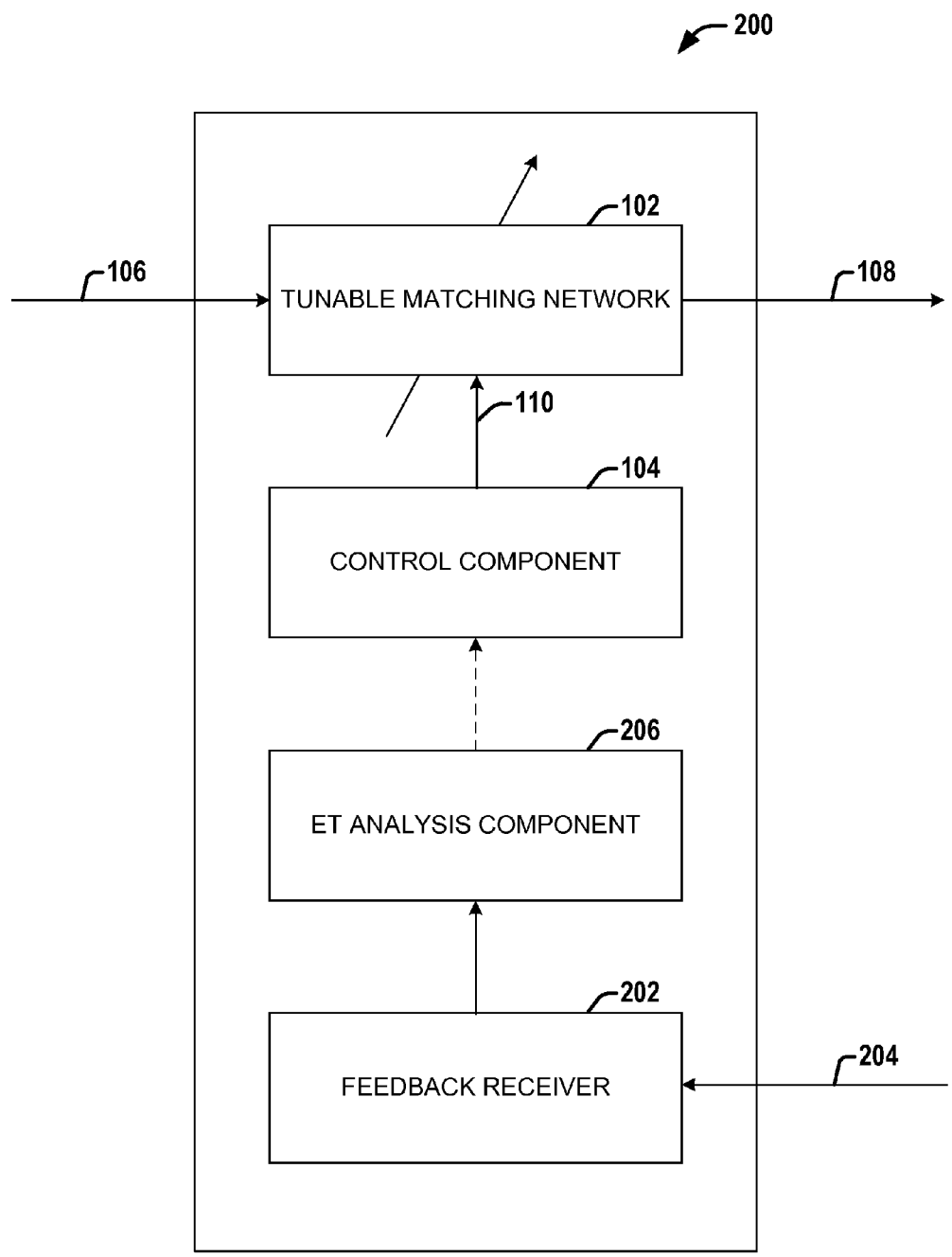
FIG. 2 is a block diagram illustrating another system or device that facilitates ET and includes a feedback receiver according to various aspects described herein.

Referring to FIG. 2, illustrated is a block diagram of another system 200 that facilitates ET and includes a feedback receiver 202 according to various aspects described herein. In addition to tunable matching network 102 and control component 104, system 200 can include a feedback receiver 202 and an ET analysis component 206.

Feedback receiver 202 can receive a transmit signal 204 output via the at least one filter, or via another component that received a filter output signal from the at least one filter (e.g., antenna port, coupler, antenna, etc.). ET analysis component 206 can analyze the transmit signal and determine at least one of the one more ET characteristics.

In aspects, one or more test signals can be provided through tunable matching network 102 and received at feedback receiver 202 (via the at least one filter, etc.). For each of a plurality of sets of operating conditions (e.g., frequencies or frequency ranges, temperatures, etc.), different impedances of tunable matching network 102 can be selected, and ET analysis component 206 can analyze the received one or more test signals to determine which impedance of tunable matching network 102 optimizes the one or more ET characteristics for a given set of operating conditions. In aspects, one or more search algorithms (e.g., binary search, etc.) can be employed to increase the efficiency of determining the impedance that optimizes the one or more ET characteristics for a given set of operating conditions. The impedance that optimizes the one or more ET characteristics for a given set of operating conditions can be stored in control component 104 or in associated memory (e.g., in a lookup table, etc.). This can be repeated for multiple sets of operating conditions, until impedances are determined for each set of operating conditions of the plurality of sets of operating conditions. Upon the present set of operating conditions matching one of the plurality of sets of operating conditions, control component 104 can send a corresponding control signal 110 to tunable matching network 102 to adjust its impedance accordingly.

In aspects employing sub-bands, sub-bands (and sizes and center frequencies) can be determined in a similar manner, as the frequency range over which a first impedance of the tunable matching network 102 optimizes the one or more ET characteristics can be associated with a first sub-band, the frequency range over which a second impedance of the tunable matching network 102 optimizes the one or more ET characteristics can be associated with a second sub-band, etc.

In some aspects, determining impedances of tunable matching network 102 that optimize the one or more ET characteristics for a set of operating conditions can occur a single time (e.g., in a factory, as part of an initial optimization, etc.). However, in other aspects, this can occur multiple times, e.g., as part of a startup or power-up sequence of a user equipment comprising system 200, or periodically, etc. In embodiments which do not comprise feedback receiver 202 and ET analysis component 206, a similar process of determining impedances that optimize the one or more ET characteristics can be employed using external testing components.

Figure 3:
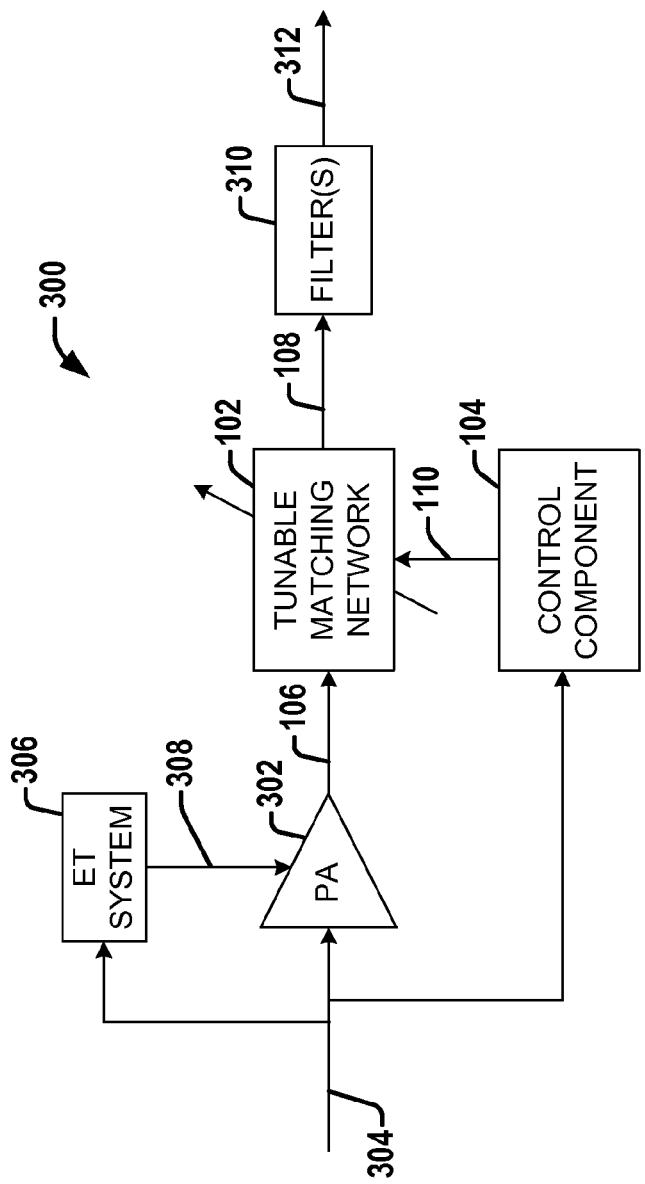
FIG. 3 is a block diagram illustrating another system or device that facilitates ET and includes a power amplifier (PA) and at least one filter according to various aspects described herein.

Referring to FIG. 3, illustrated is a block diagram of another system 300 that facilitates ET and includes a power amplifier (PA) 302 and at least one filter 310 according to various aspects described herein. In addition to components described above, system 300 can comprise a PA 302, ET system 306, and at least one filter 310. An RF signal 304 can be provided to PA 302 and ET system 306. Based on the RF signal 304, ET system can provide a variable supply voltage 308 to PA 302 that tracks the instantaneous envelope of RF signal 304, removing the voltage headroom and improving the efficiency of system 300, in accordance with ET aspects described herein. In aspects discussed herein, filtered output signal 312 output by a filter 310 can be analyzed to determine impedances of tunable matching network 102 that optimize the one or more ET characteristics for various sets of operating conditions. In some embodiments, this analysis can be performed via external measurement or test equipment, such as for a one-time calibration (e.g., initially at a factory, etc.) of control component 104. In other embodiments, internal measurement or test equipment can perform this analysis (e.g., feedback receiver 202 and ET analysis component 204, etc.), either on a one-time basis, or on multiple occasions. The determined impedance that optimize the one or more ET characteristics for various sets of operating conditions can be stored in control component 104, for example, in a lookup table, algorithm, etc. Additionally, RF signal 304 can be provided to control component 104, which can analyze RF signal 304 and determine the present set of operating conditions based at least in part on the analysis of RF signal 304.

PA 302 or other power amplifiers discussed herein can be a component of a radio frequency transmitter/receiver, or other communication device, for example. These power amplifiers can be configured to receive an envelope supply voltage or a modulated supply voltage based on the envelope tracking pathway to ensure that operation is constantly adjusted so that the power amplifier is operating at or close a peak or maximum efficiency for a given instantaneous output power requirement. These power amplifiers, for example, can comprise a first input coupled to the envelope tracking pathway and a second input that is different from the first input, which is coupled to the main signal processing pathway. The second input, for example, can be for receiving an up-converted or down-converted signal that is derived from the signal processing of one or more input signals to the system (e.g., a radio frequency (RF) signal, or other communication input signal).

In one aspect, the envelope tracking path (the path through ET system 306) comprises a variable delay component (which can be a sub-component of ET system 306) that is configured to adjust a delay of the envelope tracking path to correspond with the main signal processing path. The delay is often set or calibrated during or at manufacturing. However, variations can occur from the initial calibration of the delay of the envelope tracking path with respect to the main signal processing path, such as from age, path interferences, process, voltage or temperature (PVT) dependencies, etc., for example. In aspects, the delay component can be calibrated or re-calibrated dynamically during an active mode when operating in working or field conditions after a manufacturing calibration or as an initial calibration during manufacturing as well.

Figure 4:
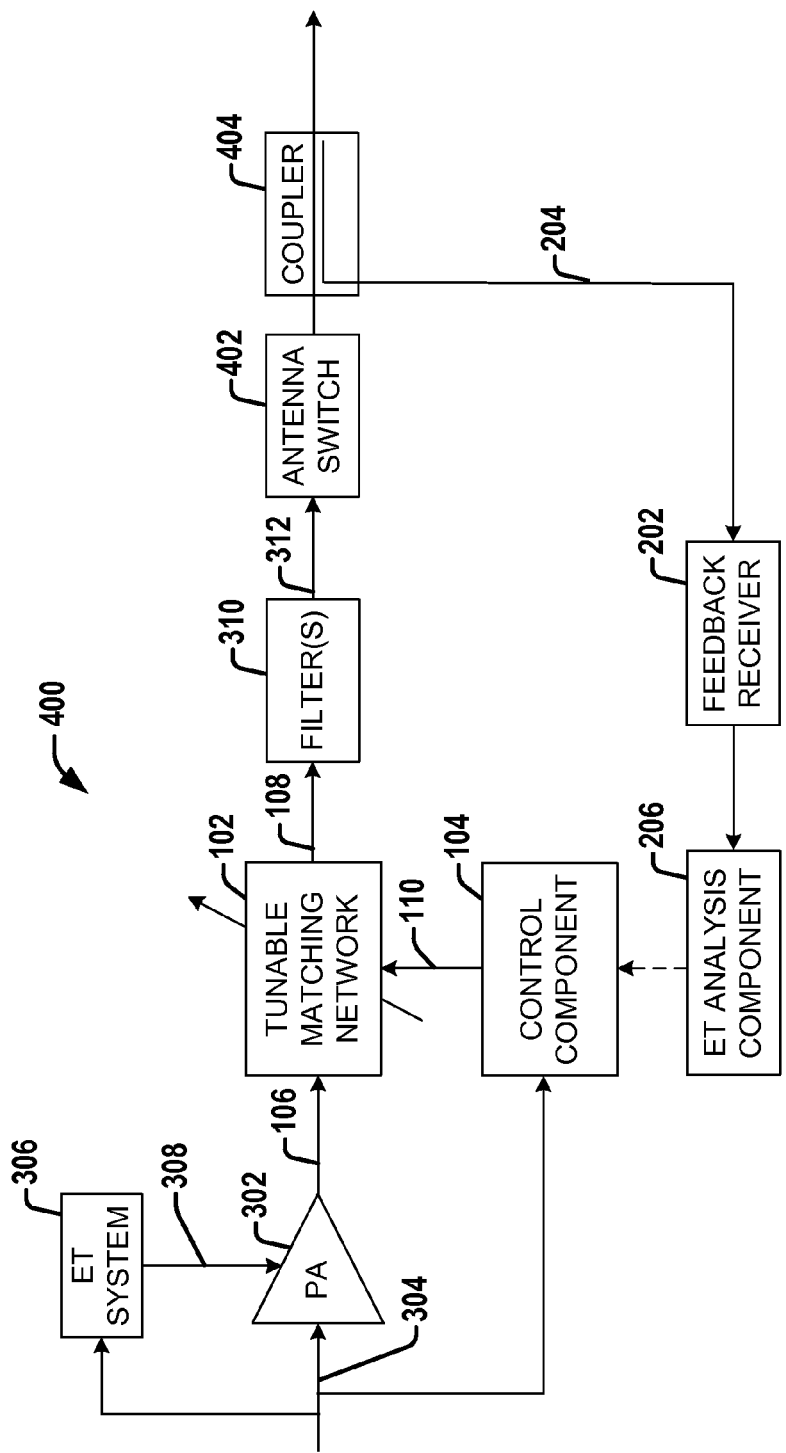
FIG. 4 is a block diagram illustrating another system or device that facilitates ET and includes a PA, at least one filter, and a feedback receiver according to various aspects described herein.

Referring to FIG. 4, illustrated is a block diagram of another system 400 that facilitates ET and includes a PA 302, at least one filter 310, and a feedback receiver 202 according to various aspects described herein. In addition to components described above, system 400 can additionally include an antenna switch 402 coupled to the at least one filter 310, and a coupler 404 that can provide transmit signal 204 to feedback receiver 202 and to an antenna (not shown) via an antenna port configured to couple to the antenna (not shown). Feedback receiver 202 can receive transmit signal 204 and provide it to ET analysis component 206. ET analysis component 206 can analyze the received transmit signal 204 to determine the one or more ET characteristics. By analyzing the one or more ET characteristics, ET analysis component 206 can determine how the one or more ET characteristics change based on changes in the set of present operating conditions, or changes in the impedance of tunable matching network 102. In various aspects, feedback receiver 202 and ET analysis component 206 can determine impedances of tunable matching network 102 that optimize the one or more ET characteristics for multiple sets (e.g., all, all within an expected range of operating conditions (e.g., frequency range(s), temperature range(s), etc.), other collections of multiple sets, etc.) of present operating conditions. For example, for a first set of present operating conditions, the impedance of tunable matching network 102 can be varied, and the resulting transmit signal 204 can be received by feedback receiver 202 and analyzed by ET analysis component 206 until an impedance of tunable matching network 102 is found that optimizes the one or more ET characteristics given the first set of present operating conditions. This process can be repeated for a second set of present operating conditions (e.g., and potentially a third, fourth, etc.), until a sufficient number of sets of present operating conditions have each been associated with an impedance of tunable matching network 102 that optimizes the one or more ET characteristics.

Figure 5:
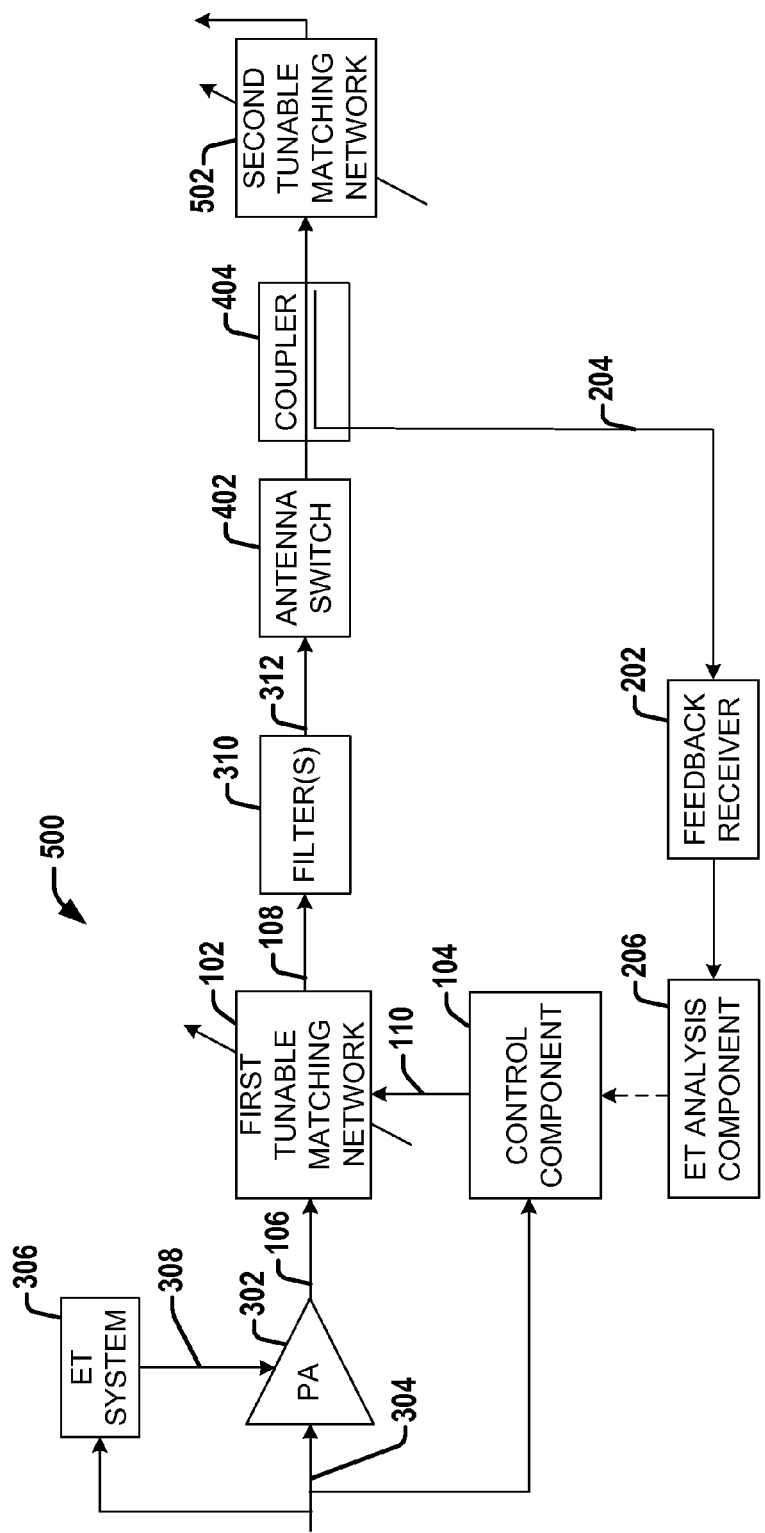
FIG. 5 is a block diagram illustrating another system or device that facilitates ET and provides for additional impedance matching according to various aspects described herein.

Referring to FIG. 5, illustrated is a block diagram of another system 500 that facilitates ET and provides for additional impedance matching according to various aspects described herein. In addition to components described above, system 500 can additionally include a second tunable matching network 502. In aspects, second tunable matching network 502 can minimize an impedance mismatch between the at least one filter 310 and the antenna, for example, by mapping an antenna impedance to a reference impedance at the input of the antenna tuner, which can be similar to or identical to a reference impedance used by the tunable matching network 102 to optimize the one or more ET characteristics. In other aspects, second tunable matching network 502 can be set to an impedance that maximizes the power of the signal transmitted through tunable matching network 502, and ultimately by the antenna.

Figure 6:
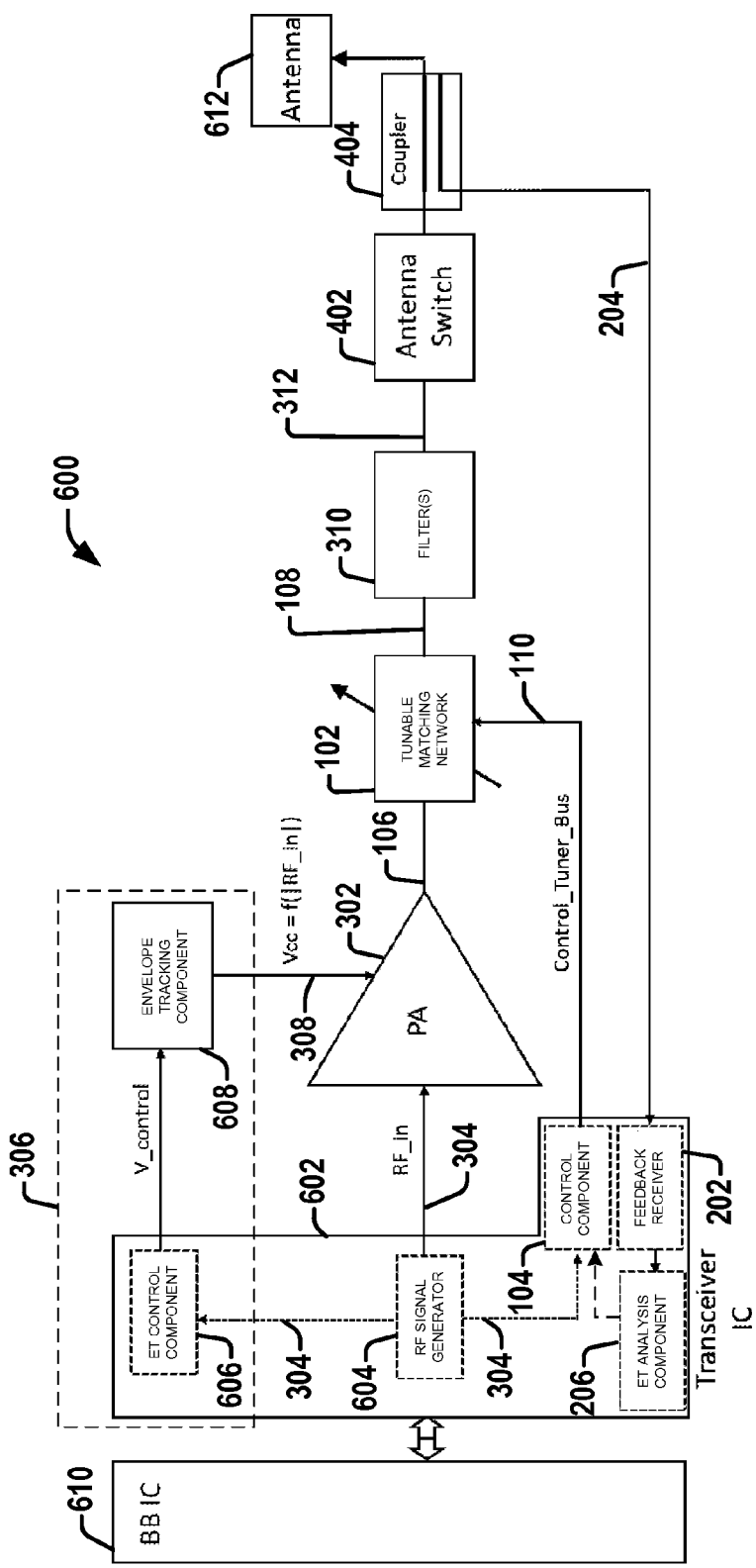
FIG. 6 is a block diagram illustrating an example embodiment of a system or device that facilitates ET according to various aspects described herein.

Referring to FIG. 6, illustrated is a block diagram of an example embodiment of a system 600 that facilitates ET according to various aspects described herein. In addition to components described above, system 600 additionally includes a transceiver IC 602, an RF signal generator 604, an ET control component 606 and an ET component 608 of the ET system 306, a baseband (BB) IC 610, and antenna 612. System 600 can comprise a baseband (BB) integrated circuit (IC) 610, antenna 612, and RF front end (comprising the components of system 600 aside from BB IC 610 and antenna 612). In the example embodiment shown in FIG. 6, transceiver IC 602 can include control component 104, feedback receiver 202, ET analysis component 206, RF signal generator 604, and ET control component 606, although in various embodiments, these components need not be on transceiver IC 602 or co-located.

In addition to performing baseband processing of down-converted received signals, baseband IC 610 can generate and encode baseband signals for subsequent up-conversion and transmission through system 600. The components of system 600 aside from the baseband IC 610 and antenna 612 can comprise an RF front end that up-converts and amplifies the baseband signal for transmission through antenna 612. RF signal generator 604 can modulate or up-convert a baseband signal received from baseband IC 610 to generate RF signal 304. ET system 306 can provide a variable supply voltage $V_{CC}$ 308 to PA 302 that tracks the instantaneous envelope of RF signal 304. ET control component 606 analyzes RF signal 304 and determines an ET control signal (V_control) that is provided to ET component 608. Based on the received ET control signal V_control, ET component 608 generates a variable supply voltage ($V_{CC}$) 308 that tracks the instantaneous envelope of RF signal 304. As discussed above, the input impedance of the at least one filter 310 has a rapidly changing phase and magnitude across frequency, changing the load characteristics of PA 302, and impacting the performance of the combination of ET system 306 and PA 302 in multiple ways as PA 302 amplifies RF signal 304 over portions of the transmit band. Because of this, tunable matching network 102 can be included, which can selectively alter the load characteristics of PA 302 by adjusting the impedance of tunable matching network 102 to optimize one or more ET characteristics (e.g., ET delay dispersion, gain dispersion, etc.). Control component 104 can determine the appropriate impedance for tunable matching network 102 based on of a present set of operating conditions, which can include one or more of a frequency range of RF signal 304, temperature, etc. Based on the analysis, control component 104 can determine an appropriate impedance for tunable matching network 102 and send a control signal (Control_Tuner_Bus) 110 to tunable matching network 102, which can then adjust its impedance to the appropriate value. By optimizing the one or more ET characteristics, the system can realize overall efficiency gains from the ET system over its entire transmit band, even for wideband transmissions. Antenna 612 can receive and transmit signals to and from one or more wireless devices such as access points, access terminals, wireless ports, routers and so forth, which can operate within a radio access network or other communication network generated via a network device.

Figure 7:
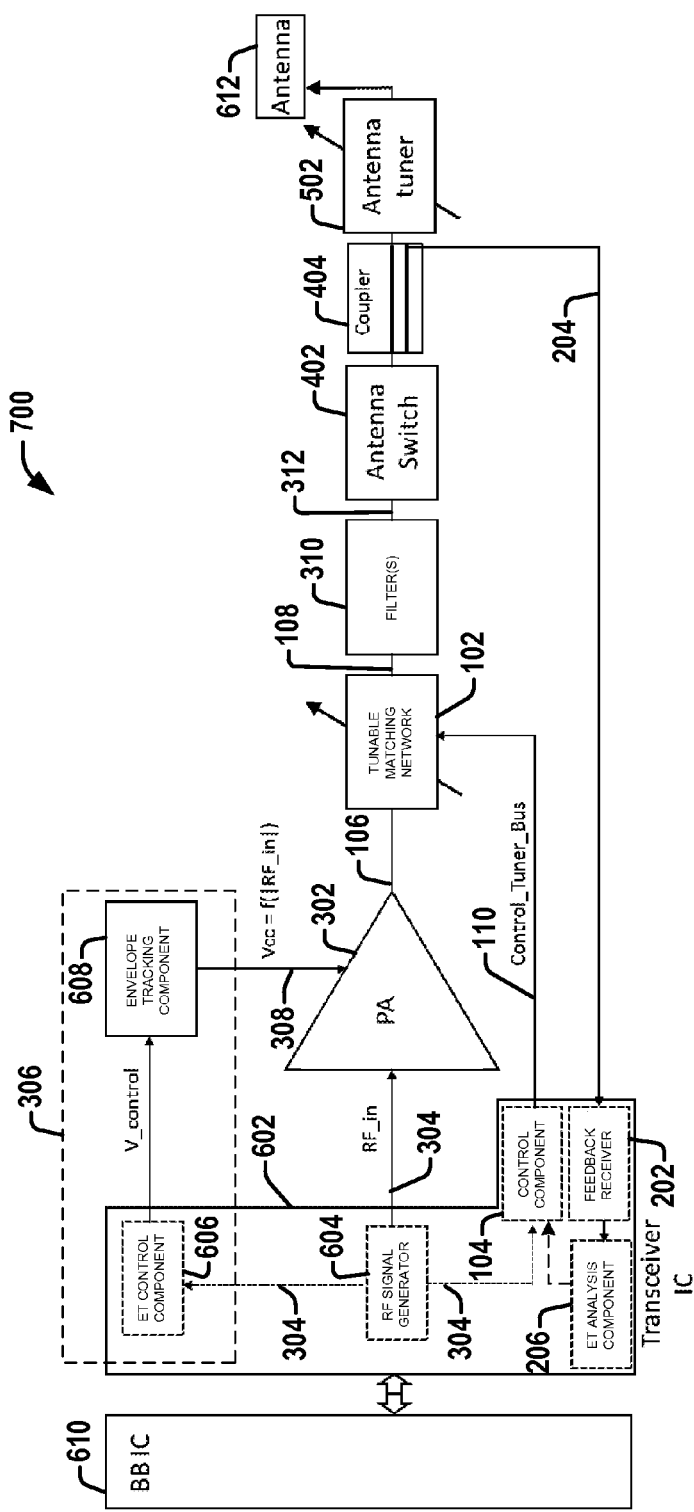
FIG. 7 is a block diagram illustrating an example embodiment of an alternative system or device that facilitates ET according to various aspects described herein.

Referring to FIG. 7, illustrated is a block diagram of an example embodiment of an alternative system 700 that facilitates ET according to various aspects described herein. System 700 is a similar embodiment to system 600, but additionally incorporates antenna tuner or second matching network 502, described above.

Figure 8:
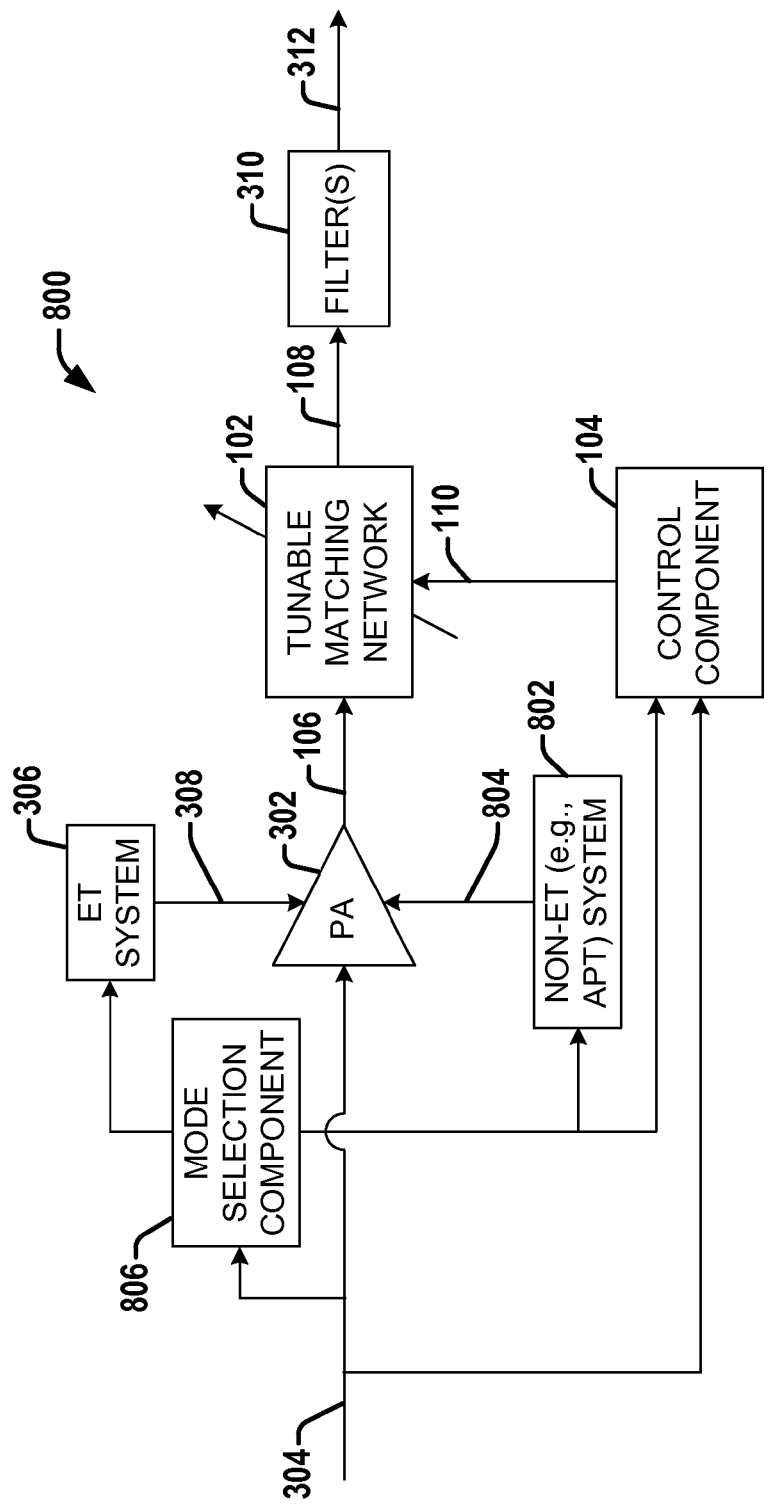
FIG. 8 is a block diagram illustrating another system or device that facilitates ET as well as a non-ET mode according to various aspects described herein.

Referring to FIG. 8, illustrated is a block diagram of another system 800 that facilitates ET as well as a non-ET mode according to various aspects described herein. In addition to components described above, system 800 can additionally include a non-ET system 802 for providing a non-ET supply voltage 804 to PA 302 in accordance with a different mode of operation (e.g., a different power management technology such as APT, etc.). Mode selection component 806 comprises one or more switches, such as transistor switches, or other switching components such as a single-pole double-throw, a double-pole single-throw, a double-pole double-throw, or other like switching component that can be utilized to switch between ET system 306 or non-ET system 802. Control component 104 can receive a mode selection signal from mode selection component 802 indicating a current mode of operation (e.g., ET mode, non-ET mode, etc.). When the system is operating in ET mode, control component 104 can operate substantially as described elsewhere herein, analyzing a set of present operating conditions to determine an appropriate impedance, and sending a control signal to tunable matching network 102 to adjust its impedance to the appropriate impedance to optimize the one or more ET characteristics given the set of present operating conditions. Additionally, however, upon detection of a non-ET mode of operation, control component 104 can send an alternate control signal to tunable matching network 102 to adjust its impedance to optimize load characteristics of the PA 302 for a constant supply voltage, as opposed to optimizing the one or more ET characteristics. Upon detection of the ET mode of operation (e.g., subsequently, etc.), control component 104 can return to analyzing the set of present operating conditions, determining an appropriate impedance to optimize the one or more ET characteristics, and sending a control signal on such a basis.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
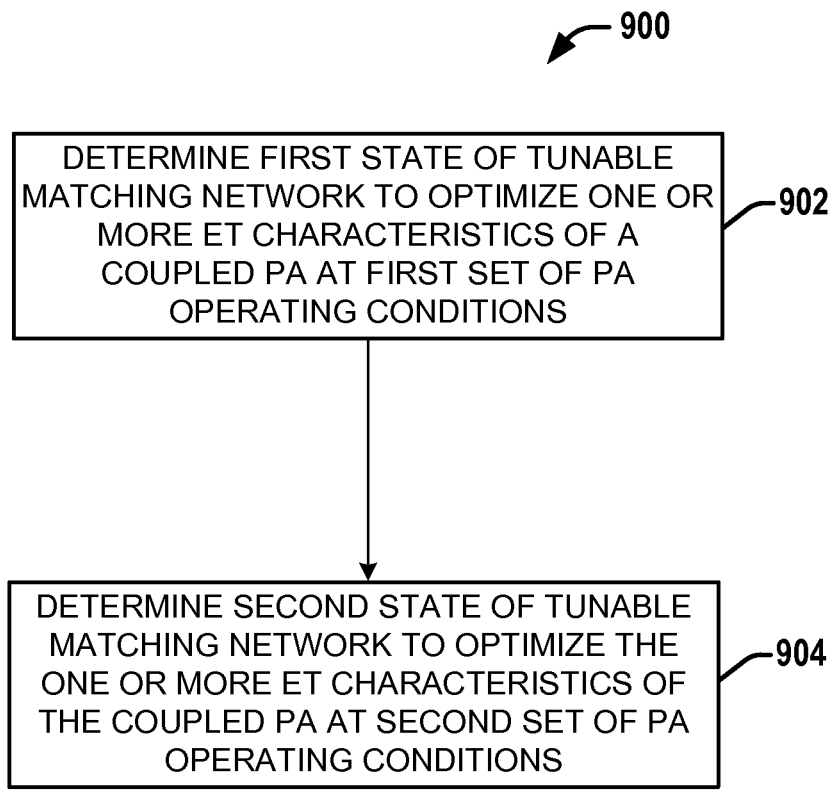
FIG. 9 is a flow diagram illustrating a method that facilitates ET according to various aspects described herein.

Referring now to FIG. 9, illustrated is a method 900 for facilitating ET according to various aspects described herein. Method 900 can initiate at 902 with determining a first state (e.g., impedance, etc.) of a tunable matching network that optimizes one or more ET characteristics for a first set of operating conditions (e.g., one or more of frequency or frequency range of operation, temperature, etc.) of a coupled PA that operates in an ET mode within a transmit band.

At 904, method 900 can include determining a second state of a tunable matching network that optimizes the one or more ET characteristics for a second set of operating conditions of the coupled PA. Optionally, additional states (e.g., third, fourth, etc.) can be determined to optimize the one or more ET characteristics for additional sets of operating conditions (e.g., third, fourth, etc.).

In aspects, a transmit band of the coupled PA can be subdivided into two or more sub-bands, and sets of operating conditions can include operation within a given sub-band. In such cases, the first state can be a state that optimizes the one or more ET characteristics in a first sub-band of the two or more sub-bands, and the second state can be a state that optimizes the one or more ET characteristics in a second sub-band of the two or more sub-bands. Optimizing the one or more ET characteristics can include making a variance of an ET characteristic linear or flat (or determining a state that minimizes the variance for a given set of operating conditions). In such situations, the first state can minimize a variance of an ET characteristic for the first set of operating conditions (e.g., which can include operation within a first sub-band), and the second state can minimize a variance of an ET characteristic for the second set of operating conditions (e.g., which can include operation within a first sub-band).

Figure 10:
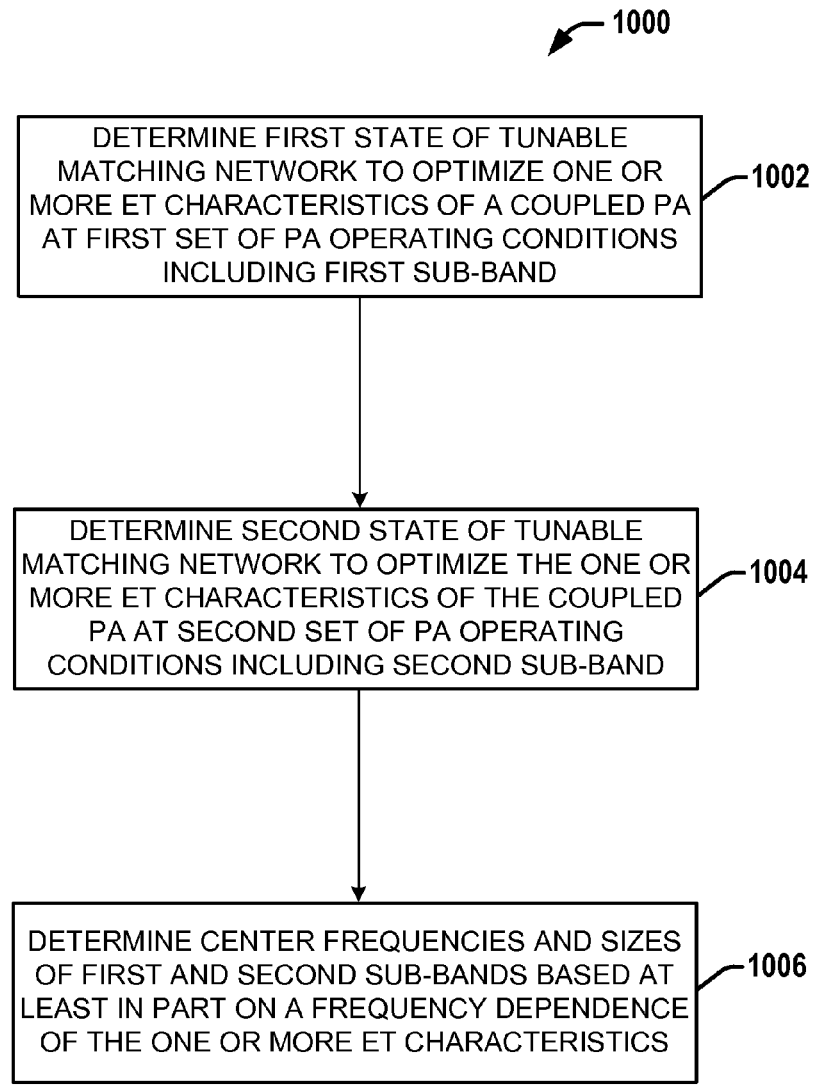
FIG. 10 is a flow diagram illustrating an alternative method that facilitates ET according to various aspects described herein.

Referring to FIG. 10, illustrated is an alternative method 1000 for facilitating ET according to various aspects described herein. Method 1000 can initiate at 1002 with determining a first state of a tunable matching network to optimize one or more ET characteristics of a coupled PA at a first set of operating conditions that include operating within a first sub-band.

At 1004, a second state of a tunable matching network can be determined to optimize the one or more ET characteristics of the coupled PA at a second set of operating conditions that include operating within a second sub-band.

At 1006, center frequencies and sizes of the first and second sub-bands can be determined based at least in part on a frequency dependence of at least one of the one or more ET characteristics (e.g., based on an ET delay dispersion, gain dispersion, etc.).

Figure 11:
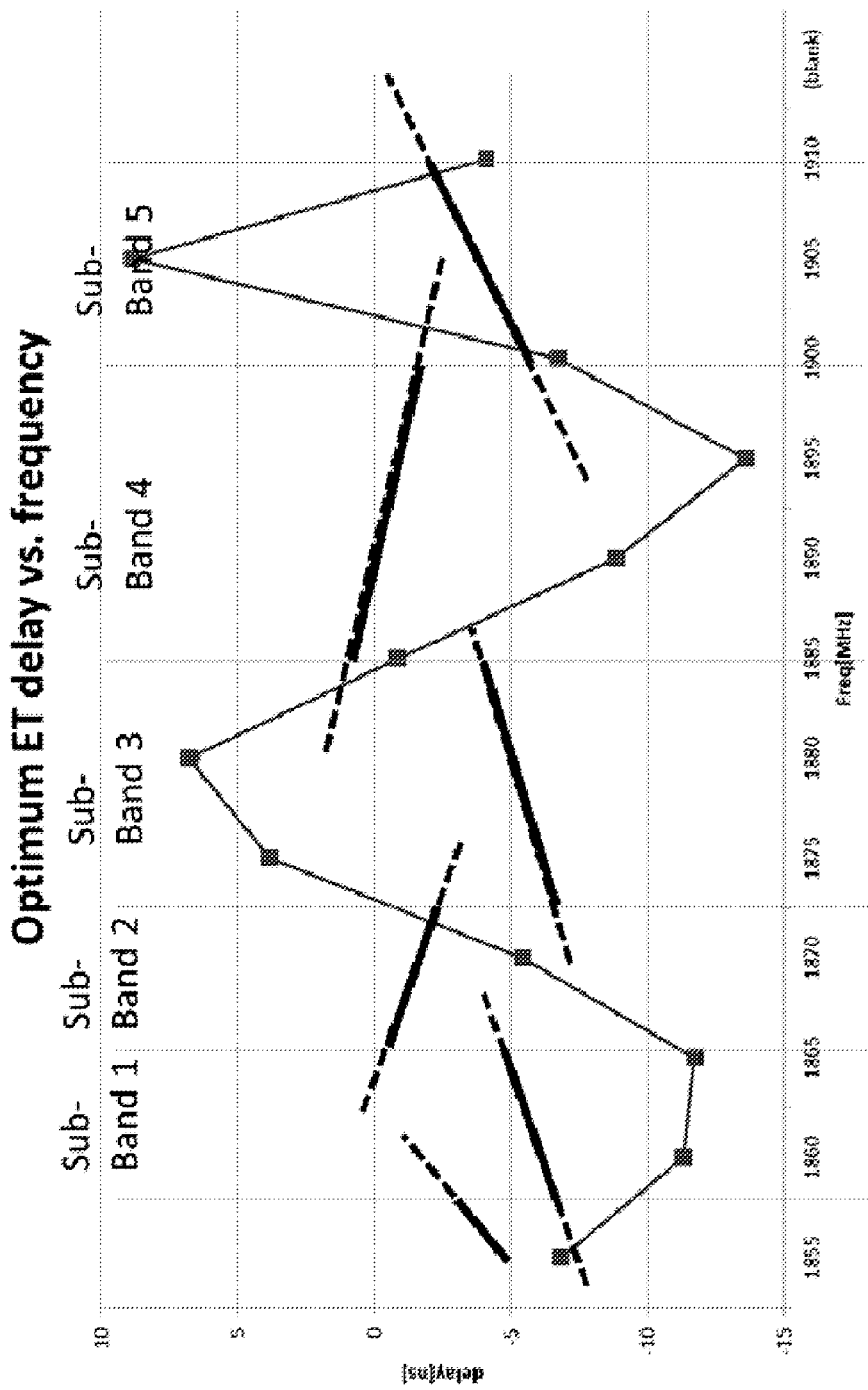
FIG. 11 is a graph illustrating the optimum ET delay as a function of frequency before and after optimization according to various aspects described herein.

Referring to FIG. 11, illustrated is a graph of the optimum ET delay as a function of frequency before and after optimization according to various aspects described herein. As discussed above, one significant challenge in conventional ET systems is filter characteristics, and a harmful interaction between the PA and filter(s) (e.g., TX filter of a duplexer, etc.). The filter(s) introduce a highly frequency-dependent PA load impedance, which is characterized by significant impedance changes in both magnitude and phase, especially at frequencies where filter resonances occur. One effect that can result from this is that the optimum ET delay might change heavily over the transmit band, or even rapidly change over a relatively small portion of the transmit band (e.g., near one or more filter resonances, etc.).

The gray data points and curve in FIG. 11 show the optimum ET delay at each of the measured frequencies across the transmit band without optimization as described herein. In the example shown in FIG. 11, based on measurements of an example ET system including a PA and a duplexer, there is a significant ET delay variation within the span of a few MHz. This makes it difficult or even impossible to achieve good performance in the ET mode over the complete transmit band. The reason for the delay variation is a mismatch with the duplexer input impedance. This ET delay variation can be reduced by changing the matching between the PA and the duplexer to generate a better matched PA load impedance in terms of ET characteristics, such as one with less phase variation over frequency.

FIG. 11 also shows an example separation of a transmit band into sub-bands in accordance with aspects described herein. The separation can be based on the ET delay variation over frequency, which is caused by the at least one filter (in the example of FIG. 11, a transmit filter of a duplexer). In frequency ranges where the ET delay rapidly changes over frequency, smaller sub-band sizes can be used (e.g., more sub-bands in those frequency ranges, etc.).

In embodiments employing sub-bands, tunable matching can be used to optimize the matching between the at least one filter (e.g., transmit filter of a duplexer, etc.) and PA output in each sub-band. Since each sub-band covers a smaller frequency range relative to the total transmit band, it is easier to optimize ET characteristics in each sub-band. In terms of ET delay dispersion, this will reduce the ET delay variation and result in a substantially flat ET delay characteristic over the complete transmit band (e.g., with flat ET delay in each sub-band, and minimal ET delay variation between sub-bands, etc.). Similarly, other ET characteristics (e.g., gain dispersion, AMAM and AMPM response clouding, etc.) will also be optimized over the entire transmit band.

The black solid lines in FIG. 11 show ET delay as a function of frequency within each sub-band after optimization for each of the sub-bands. The dashed lines indicate the ET delay outside of each sub-band based on the optimization for the sub-band with the associated solid line, which is relevant if the bandwidth of the transmit signal exceeds the size of the sub-band. Note that after the optimization, not only is the ET delay linear over frequency, but the variance of the ET delay over frequency is substantially reduced.

Referring to FIG. 12, illustrated are graphs of amplitude-to-amplitude distortion (AMAM) (at 1200) and amplitude-to-phase distortion (AMPM) (at 1210) response clouding at 887 MHz without optimization according to various aspects described herein. If the PA is loaded by at least one filter, the gain and AMAM and AMPM characteristic of the PA can significantly change within the transmission bandwidth due to resonances in the at least one filter. As discussed above, strong gain change over frequency indicates PA pulling due to filter impedance, which will cause a memory effect in a wideband signal that is visible as clouding of the AMAM and AMPM response, which can cause asymmetric and degraded ACLR characteristic, increased bit error rate, etc.

Referring now to FIG. 13, illustrated are graphs of AMAM (at 1300) and AMPM (at 1310) response with reduced clouding at 911 MHz based on optimization according to various aspects described herein. In contrast to the AMAM and AMPM response clouding in FIG. 12, the AMAM and AMPM response of FIG. 13 shows tight clouding (e.g., with less than 1 dB opening).

Figure 14:
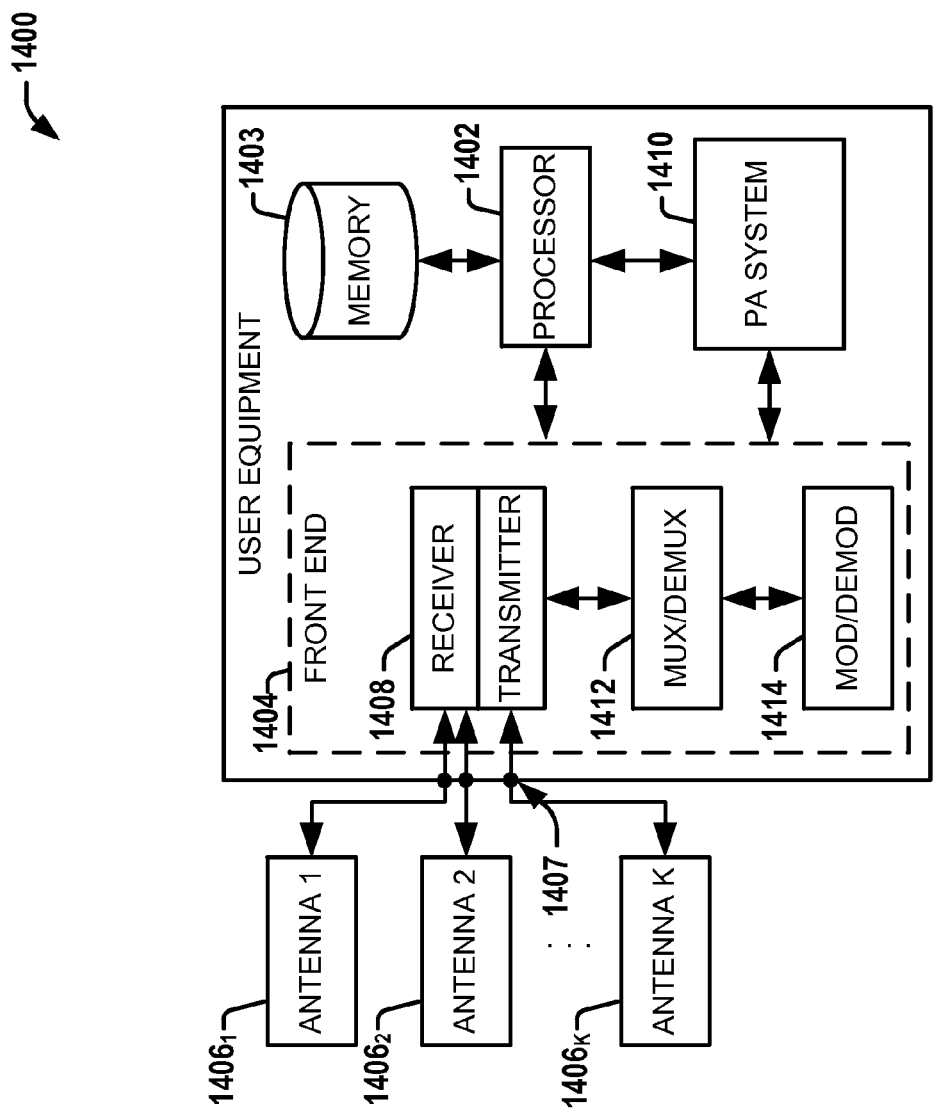
FIG. 14 is a block diagram illustrating an example user equipment useable in connection with various aspects described herein.

Referring to FIG. 14, illustrated is an exemplary user equipment or mobile communication device 1400 that can be utilized with one or more aspects of the systems, methods, or devices that facilitate envelope tracking described herein according to various aspects. The user equipment 1400, for example, comprises a digital baseband processor 1402 that can be coupled to a data store or memory 1403, a front end 1404 (e.g., an RF front end, an acoustic front end, or the other like front end) and a plurality of antenna ports 1407 for connecting to a plurality of antennas $1406_1$ to $1406_k$ (k being a positive integer). The antennas $1406_1$ to $1406_k$ can receive and transmit signals to and from one or more wireless devices such as access points, access terminals, wireless ports, routers and so forth, which can operate within a radio access network or other communication network generated via a network device. The user equipment 1400 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1404 can include a communication platform, which comprises electronic components and associated circuitry that provide for processing, manipulation or shaping of the received or transmitted signals via one or more receivers or transmitters 1408, a mux/demux component 1412, and a mod/demod component 1414. The front end 1404, for example, is coupled to the digital baseband processor 1402 and the set of antenna ports 1407, in which the set of antennas $1406_1$ to $1406_k$ can be part of the front end. In one aspect, the user equipment 1400 can comprise a PA system 1410 that operates with a delay component for providing a delay between a main signal processing path and an envelope tracking path of a PA. The delay can be dynamically (re-) calibrated according to a feedback path from the PA output, for example. In aspects, a load of PA system 1410 can be adjusted based on a set of present operating conditions (e.g., by a tunable matching network as described herein) to optimize ET characteristics based on the set of present operating conditions.

The user equipment 1400 can also include a processor 1402 or a controller that can operate to provide or control one or more components of the user equipment 1400. For example, the processor 1402 can confer functionality, at least in part, to substantially any electronic component within the user equipment 1400, in accordance with aspects of the disclosure. As an example, the processor can be configured to execute, at least in part, executable instructions that control various modes of the PA system 1410 as a multi-mode operation chipset that affords different power generation operations for input signals at the antenna ports 1407, an input terminal or other terminal based on one or more characteristics of the input signal.

The processor 1402 can operate to enable the mobile communication device 1400 to process data (e.g., symbols, bits, or chips) for multiplexing/demultiplexing with the mux/demux component 1412, or modulation/demodulation via the mod/demod component 1414, such as implementing direct and inverse fast Fourier transforms, selection of modulation rates, selection of data packet formats, inter-packet times, etc. Memory 1403 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 1402 is functionally and/or communicatively coupled (e.g., through a memory bus) to memory 1403 in order to store or retrieve information necessary to operate and confer functionality, at least in part, to communication platform or front end 1404, the PA system 1410 and substantially any other operational aspects of the PA system 1410. The PA system 1410 includes at least one power amplifier in the RF front end 1404 that can employ an envelope tracking mode of operation in order to improve an efficiency or battery life of the user equipment 1400. While the components in FIG. 14 are illustrated in the context of a user equipment, such illustration is not limited to user equipment but also extends to other wireless communication devices, such as base station, small cell, femtocell, macro cell, microcell, etc.

Figure 15:
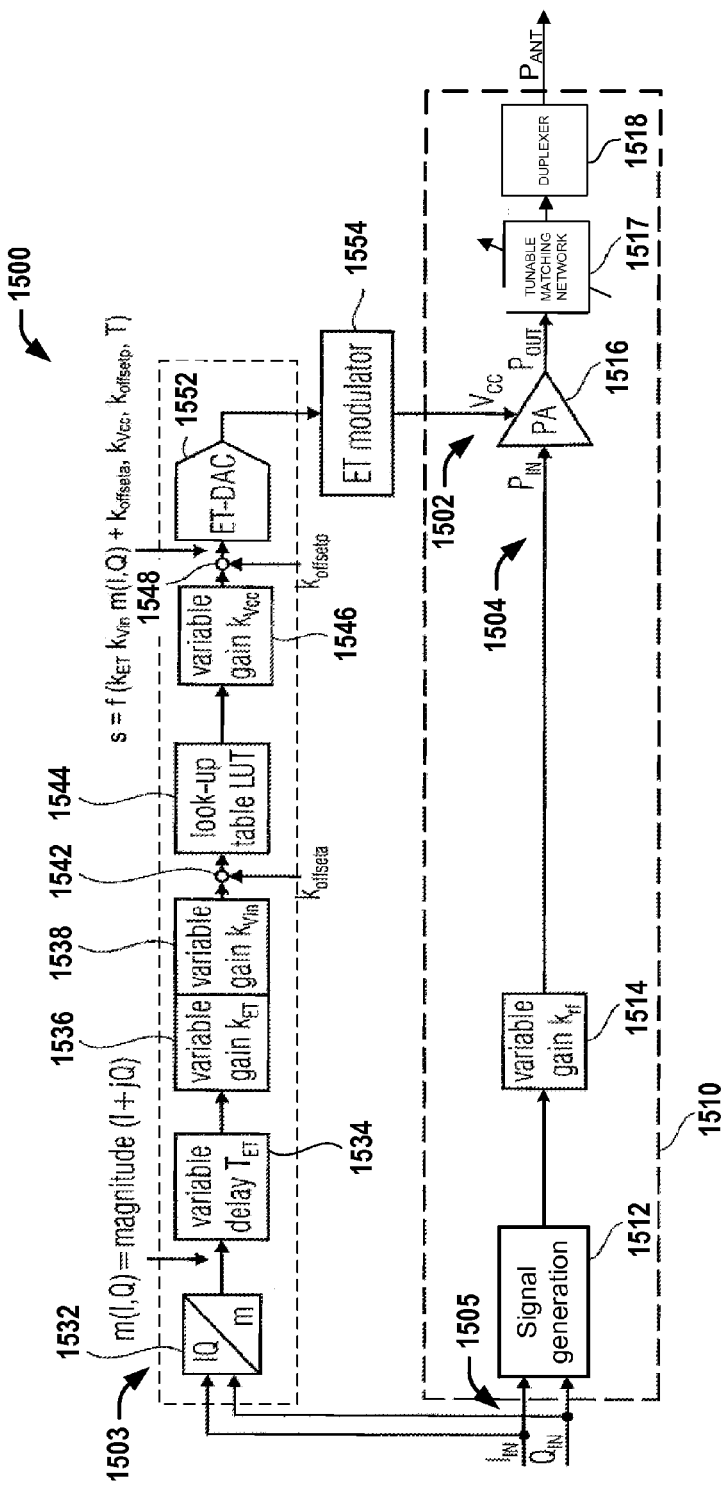
FIG. 15 is a block diagram illustrating a power amplifier (PA) capable of operating in an ET mode in connection with various aspects described herein.

Referring to FIG. 15, illustrated is a schematic block diagram of an envelope tracking system 1500 with a power amplifier 1516 that has an input terminal 1502 that is part of an envelope tracking pathway 1503 and an input terminal 1504 that is part of a signal generation pathway 1510. An input terminal 1505 or an input signal 1505 (e.g., a differential signal, a single ended signal, an RF signal, an acoustic signal, or other like communication signal) to be processed or transmitted, can comprise, for example, an in-phase component $I_{IN}$ and a quadrature component $Q_{IN}$. Alternatively or additionally, the input signal 1505 can comprise a different format as a single or a differential signal. The input signal 1505 is received by a signal generation path 1510 that comprises an RF signal generation component 1512, a variable gain element 1514, a power amplifier (PA) 1516, and a duplexer 1518. The signal generation component 1512 can be configured to perform frequency up-conversion, for example, from a baseband (BB) frequency range to a radio frequency range, or generate a different conversion operation, such as a digital-to-analog conversion of the input signal 1505. The variable gain element 1514 is configured to multiply an output of the signal generation component 1512 with a variable gain (e.g., $k_{rf}$) that serves to achieve a desired gain setting of the entire signal generation path 1514 as part of the power amplifier system 1500. The power amplifier 1516 amplifies the signal provided by the variable gain element 1514, wherein an input power of the PA 1516 is $P_{IN}$ and an output power is $P_{OUT}$. The amplified amplifier output signal (Pout) is then fed, via a tunable matching network 1517 in accordance with aspects described herein, to the duplexer 1518, which separates transmitted and received signals in the frequency domain. At an antenna port of the duplexer 1518, the output signal is typically slightly attenuated to an antenna power $P_{ANT}$, compared to the output power $P_{OUT}$ of the power amplifier 1516.

One envelope tracking specific design target on a system level is a flat AMPM- and AMAM phase response of the PA 1516 versus PA supply voltage $V_{CC}$ and across output power (in this context PA supply voltage $V_{CC}$ refers to the voltage that is influenced by an envelope tracking operation, for example, the supply voltage of a $2^{nd}$ PA stage). The abbreviation AMPM stands for "amplitude-to-phase distortion" and the abbreviation AMAM stands for "amplitude-to-amplitude distortion".

The lookup table 1544 can be part of the envelope tracking path 1503 or a supply voltage processing path, which is depicted above the main signal generation path 1510. The supply voltage processing path 1503 is also considered a part of the envelope tracking system 1500. The supply voltage processing path 1503 can comprise a vector-to-magnitude converter 1532 (e.g., implementing a CORDIC algorithm, etc.). The instantaneous magnitude of the input signal 1505 can be expressed as m(I,Q)=magnitude (I+jQ), which is forwarded to a variable delay element 1534 configured to delay the magnitude signal by a delay $T_{ET}$ to aid in synchronizing the variation in $V_{CC}$ with the envelope of the RF signal in the signal generation path 1510. The supply voltage processing path 1503 further comprises a variable gain element 1536 with a variable gain $k_{ET}$. The variable gain $k_{ET}$ can be synchronized with the variable gain $k_{rf}$ of the transmitter 1510 (not explicitly shown in FIG. 15). At a summing element 1542, an input signal offset $k_{offseta}$ is added before the signal is provided to a lookup table (LUT) 1544. The lookup table 1544 implements a nonlinear transfer function or at least the basic shape of the nonlinear transfer function. The supply voltage processing path 1503 further comprises a further variable gain element 1546 for applying a variable gain $k_{VCC}$ to an output signal of the lookup table 1544. At a further summing element 1548 an output signal offset $k_{offsetp}$ is added before the signal is digital-to-analog converted by an envelope tracking digital-to-analog converter (ET-DAC) 1552. An analog output signal of the ET-DAC 1552 is provided to the ET modulator 1554 (e.g., ET DC-DC voltage provider) as a variable or dynamic control signal and to cause the ET modulator 1554 to provide a corresponding supply voltage $V_{CC}$ to the envelope tracking power amplifier 1516 for providing an output voltage or output power signal at a maximum efficiency.

The delay of the delay component 1534 can be sensitive to part-to-part variations along the main signal processing path 1510 and the envelope tracking path 1503, as well as to aging and PVT dependencies, for example. Therefore, the delay is calibrated during production of the power amplifier system 1500 or of a communication device/transmitter/receiver/transceiver that comprises the power amplifier system 1500. In one aspect, re-calibration is dynamic and can be facilitated by the power system 1500 after production on-the-fly or in real-time during an active transmission or during active communications of the device in the field during an active transmission mode or an active mode of operation in order to compensate for the aging effects, PVT dependencies, or other variations.

In some instances, the variable delay may only be calibrated once during factory calibration for a 50 ohm termination. However, factory calibration has different limitations as follows: (1) the delay might change over time, and (2) the factory calibration process does not fully reflect real-life use cases of a mobile device (e.g., the antenna impedance does change depending on the position of the mobile communication device relative to the mobile device user). Antenna impedance change can also affect the PA behavior (e.g., for some antenna impedances the PA supply $V_{CC}$ has to be increased to maintain antenna output power and for other antenna impedances the PA supply Vcc needs to be decreased to reach the same output power). As a result, the actual delay or actual delay function of the delay component 1534 is subject to deviate from a target delay that was established during factory calibration in a calibration mode, for example, which is different from an active transmission mode in the field or thereafter. As such, these variations can cause degradation of an adjacent channel leakage ratio (ACLR) or an error vector magnitude (EVM) performance, for example. These conditions discussed above can be mitigated or avoided by dynamically re-adjusting the delay or the delay function of the delay component $T_{ET}$ 1534 according to various aspects described.

Several measures can be carried out to compensate possible delay changes. The power amplifier system 1500 can perform dynamic calibration or setting of the delay component 1534 in the envelope tracking path 1503 according to 1) a re-calibration during an active transmission or an active power generation mode of the power amplifier during operation, 2) on-the-fly re-calibration without interfering with the information inherent in the received input signal 1505 (e.g., an RF signal, acoustic signal or the like), 3) on-the-fly re-calibration without violation of the spectral mask of the input signal 1505, or an impedance of tunable matching network 1517 can be adjusted to alter how ET delay and other ET characteristics vary based on operating conditions. Tunable matching network 1517 can perform the same functions of tunable matching network 102. In connection with an ET mode of operation, for example, tunable matching network 1517 can receive a control signal (e.g., control signal 110, etc.) and adjust its impedance to an impedance that optimizes one or more ET characteristics (e.g., ET delay, gain, etc.), compensating for the highly frequency and phase dependent load characteristics of duplexer 1518, and allowing for improved efficiency gains from ET for the entire transmit band.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a system for envelope tracking, which includes a tunable matching network and a control component. The tunable matching network is configured to couple to at least one filter and to a power amplifier that is configured to operate in an envelope tracking (ET) mode of operation over a transmit band. The control component is configured to detect a present set of operating conditions of the power amplifier when the power amplifier operates in the ET mode of operation. The control component is further configured to transmit a control signal to the tunable matching network in response to the detected present set of operating conditions. The tunable matching network is further configured to adjust an impedance of the tunable matching network in response to the transmitted control signal to optimize one or more ET characteristics of the power amplifier based at least in part on the present set of operating conditions.

Example 2 includes the subject matter of example 1, wherein the present set of operating conditions comprises a present frequency of operation.

Example 3 includes the subject matter of example 1 or example 2, wherein the one or more ET characteristics comprise at least one of an ET delay variation over frequency and a gain variation over frequency.

Example 4 includes the subject matter of any of examples 1-3, wherein the one or more ET characteristics comprise a clouding of at least one of an amplitude-to-amplitude distortion (AMAM) or an amplitude-to-phase distortion (AMPM).

Example 5 includes the subject matter of any of examples 1-4, wherein the transmit band comprises two or more sub-bands. A first sub-band of the two or more sub-bands comprises the present frequency, and the one or more ET characteristics are optimized over the first sub-band.

Example 6 includes the subject matter of any variation of example 5, including or omitting optional elements, wherein the transmit band is divided into the two or more sub-bands based at least in part on a frequency response of an input impedance of the at least one filter.

Example 7 includes the subject matter of any of examples 1-6, where the system further includes a feedback receiver configured to receive a radio frequency (RF) transmit signal output via the at least one filter and an ET analysis component configured to determine at least one of the one or more ET characteristics based at least in part on an analysis of the RF transmit signal.

Example 8 includes the subject matter of any variation of example 7, including or omitting optional elements, wherein the ET analysis component is configured to determine the at least one of the one or more ET characteristics based at least in part on one or more test signals.

Example 9 includes the subject matter of any variation of examples 7 or 8, including or omitting optional elements, wherein the ET analysis component is configured to determine the at least one of the one or more ET characteristics during a power-up sequence.

Example 10 includes the subject matter of any of examples 1-9, wherein the at least one filter comprises a transmit filter of a duplexer.

Example 11 includes the subject matter of any of examples 1-10, wherein the power amplifier is further configured to operate in a non-ET mode of operation. The control component is further configured to detect when the power amplifier operates in the non-ET mode of operation, and the control component is further configured to transmit a second control signal to the tunable matching network in response to the detected non-ET mode of operation. The tunable matching network is further configured to adjust the impedance of the tunable matching network in response to the transmitted second control signal to maximize an output power of the power amplifier.

Example 12 includes the subject matter of example 1, wherein the one or more ET characteristics comprise at least one of an ET delay variation over frequency and a gain variation over frequency.

Example 13 includes the subject matter of example 1, wherein the one or more ET characteristics comprise a clouding of at least one of an amplitude-to-amplitude distortion (AMAM) or an amplitude-to-phase distortion (AMPM).

Example 14 includes the subject matter of example 1, wherein the transmit band comprises two or more sub-bands. A first sub-band of the two or more sub-bands comprises the present frequency, and the one or more ET characteristics are optimized over the first sub-band.

Example 15 includes the subject matter of example 14, wherein the transmit band is divided into the two or more sub-bands based at least in part on a frequency response of an input impedance of the at least one filter.

Example 16 includes the subject matter of example 1, where the system further includes a feedback receiver configured to receive a radio frequency (RF) transmit signal output via the at least one filter and an ET analysis component configured to determine at least one of the one or more ET characteristics based at least in part on an analysis of the RF transmit signal Example 17 includes the subject matter of example 16, wherein the ET analysis component is configured to determine the at least one of the one or more ET characteristics based at least in part on one or more test signals.

Example 18 includes the subject matter of example 16, wherein the ET analysis component is configured to determine the at least one of the one or more ET characteristics during a power-up sequence.

Example 19 includes the subject matter of example 1, wherein the at least one filter comprises a transmit filter of a duplexer.

Example 20 includes the subject matter of example 1, wherein the power amplifier is further configured to operate in a non-ET mode of operation. The control component is further configured to detect when the power amplifier operates in the non-ET mode of operation, and the control component is further configured to transmit a second control signal to the tunable matching network in response to the detected non-ET mode of operation. The tunable matching network is further configured to adjust the impedance of the tunable matching network in response to the transmitted second control signal to maximize an output power of the power amplifier.

Example 21 is a system for envelope tracking, which includes a power amplifier, at least one filter, a first tunable matching network, and a control component. The power amplifier is configured to operate in an envelope tracking (ET) mode of operation over a transmit band. The at least one filter is configured to filter an output signal of the power amplifier. The first tunable matching network is configured to couple to the power amplifier and to the at least one filter. The control component is configured to detect a present set of operating conditions of the power amplifier when the power amplifier operates in the ET mode of operation. The control component is further configured to transmit a control signal to the first tunable matching network in response to the detected present set of operating conditions. The first tunable matching network is further configured to adjust an impedance of the first tunable matching network in response to the transmitted control signal to optimize one or more ET characteristics of the power amplifier based at least in part on the present set of operating conditions.

Example 22 includes the subject matter of example 21, wherein the present set of operating conditions comprises a present frequency of operation.

Example 23 includes the subject matter of example 21, wherein the one or more ET characteristics comprise at least one of an ET delay variation over frequency and a gain variation over frequency.

Example 24 includes the subject matter of example 21, wherein the one or more ET characteristics comprise a clouding of at least one of an amplitude-to-amplitude distortion (AMAM) or an amplitude-to-phase distortion (AMPM).

Example 25 includes the subject matter of any one of examples 21-24, wherein the transmit band comprises two or more sub-bands. A first sub-band of the two or more sub-bands comprises the present frequency. The one or more ET characteristics are optimized over the first sub-band.

Example 26 includes the subject matter of any variation of example 25, including or omitting optional elements, wherein the transmit band is divided into the two or more sub-bands based at least in part on a frequency response of an input impedance of the at least one filter.

Example 27 includes the subject matter of example 21, wherein the system further comprises a second tunable matching network. The second tunable matching network configured to couple the at least one filter with an antenna port that is configured to couple to an antenna. The second tunable matching network is further configured to minimize an impedance mismatch between the at least one filter and the antenna when the antenna is coupled to the antenna port.

Example 28 includes the subject matter of example 21, where the system further includes a feedback receiver configured to receive a radio frequency (RF) transmit signal output via the at least one filter and an ET analysis component configured to determine at least one of the one or more ET characteristics based at least in part on an analysis of the RF transmit signal.

Example 29 includes the subject matter of example 28, wherein the ET analysis component is configured to determine the at least one of the one or more ET characteristics based at least in part on one or more test signals.

Example 30 includes the subject matter of example 28, wherein the ET analysis component is configured to determine the at least one of the one or more ET characteristics during a power-up sequence.

Example 31 includes the subject matter of example 21, wherein the transmit band comprises two or more sub-bands. A first sub-band of the two or more sub-bands comprises the present frequency. The one or more ET characteristics are optimized over the first sub-band.

Example 32 includes the subject matter of example 31, wherein the transmit band is divided into the two or more sub-bands based at least in part on a frequency response of an input impedance of the at least one filter.

Example 33 is a method of envelope tracking. The method includes determining a first state of a tunable matching network coupled to a power amplifier that is configured to operate within a transmit band in an envelope tracking (ET) mode of operation. The first state optimizes one or more ET characteristics at a first set of operating conditions of the power amplifier. The method also includes determining a second state of the tunable matching network coupled to the power amplifier that is configured to operate within the transmit band in the ET mode of operation. The second state optimizes the one or more ET characteristics at a second set of operating conditions of the power amplifier.

Example 34 includes the subject matter of example 33, wherein the transmit band comprises two or more sub-bands. The first set of operating conditions comprises operation of the power amplifier within a first sub-band of the two or more sub-bands, and the second set of operating conditions comprises operation of the power amplifier within a second sub-band of the two or more sub-bands.

Example 35 includes the subject matter of example 34, wherein the method further comprises determining a first center frequency of the first sub-band, a second center frequency of the second sub-band, a first size of the first sub-band, and a second size of the second sub-band. The one or more ET characteristics comprise an ET delay variation over frequency, and the first center frequency, second center frequency, first size, and second size are determined based at least in part on a frequency response of the envelope tracking delay over the transmit band.

Example 36 includes the subject matter of any of examples 34 or 35, including or omitting optional elements, wherein the first state minimizes a variance of at least one of the one or more ET characteristics within the first sub-band, and wherein the second state minimizes the variance of the at least one of the one or more ET characteristics within the second sub-band.

Example 37 includes the subject matter of example 34, wherein the first state minimizes a variance of at least one of the one or more ET characteristics within the first sub-band, and wherein the second state minimizes the variance of the at least one of the one or more ET characteristics within the second sub-band.

Example 38 is a system for envelope tracking which includes means for adjusting a load impedance of a power amplifier that is configured to operate in an envelope tracking (ET) mode of operation over a transmit band and means for detecting a present set of operating conditions of the power amplifier when the power amplifier operates in the ET mode of operation. The means for adjusting are configured to couple to the power amplifier and to at least one filter. The means for detecting is further configured to transmit a control signal to the means for adjusting network in response to the detected present set of operating conditions. Additionally, the means for adjusting is further configured to adjust an impedance of the means for adjusting in response to the transmitted control signal to optimize one or more ET characteristics of the power amplifier based at least in part on the present set of operating conditions.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system for envelope tracking, comprising:
   a tunable matching network configured to couple to at least one filter and to a power amplifier that is configured to operate in an envelope tracking (ET) mode of operation over a transmit band; and
   a control component configured to detect a present set of operating conditions of the power amplifier when the power amplifier operates in the ET mode of operation, wherein the control component is further configured to transmit a control signal to the tunable matching network in response to the detected present set of operating conditions,
   wherein the tunable matching network is further configured to adjust an impedance of the tunable matching network in response to the transmitted control signal to optimize one or more ET characteristics of the power amplifier based at least in part on the present set of operating conditions,
   wherein the transmit band comprises two or more sub-bands, wherein a first sub-band of the two or more sub-bands comprises the present frequency, and wherein the one or more ET characteristics are optimized over the first sub-band, and
   wherein the transmit band is divided into the two or more sub-bands based at least in part on a frequency response of an input impedance of the at least one filter.

2. The system of claim 1, wherein the present set of operating conditions comprises a present frequency of operation.

3. The system of claim 1, wherein the one or more ET characteristics comprise at least one of an ET delay variation over frequency or a gain variation over frequency.

4. The system of claim 1, wherein the one or more ET characteristics comprise a clouding of at least one of an amplitude-to-amplitude distortion (AMAM) or an amplitude-to-phase distortion (AMPM).

5. The system of claim 1, further comprising:
   a feedback receiver configured to receive a radio frequency (RF) transmit signal output via the at least one filter; and
   an ET analysis component configured to determine at least one of the one or more ET characteristics based at least in part on an analysis of the RF transmit signal.

6. The system of claim 5, wherein the ET analysis component is configured to determine the at least one of the one or more ET characteristics based at least in part on one or more test signals.

7. The system of claim 5, wherein the ET analysis component is configured to determine the at least one of the one or more ET characteristics during a power-up sequence.

8. The system of claim 1, wherein the at least one filter comprises a transmit filter of a duplexer.

9. The system of claim 1, wherein the power amplifier is further configured to operate in a non-ET mode of operation, wherein the control component is further configured to detect when the power amplifier operates in the non-ET mode of operation, wherein the control component is further configured to transmit a second control signal to the tunable matching network in response to the detected non-ET mode of operation, and wherein the tunable matching network is further configured to adjust the impedance of the tunable matching network in response to the transmitted second control signal to optimize a load impedance of the power amplifier for a constant supply voltage.

10. A system for envelope tracking, comprising:
    a power amplifier configured to operate in an envelope tracking (ET) mode of operation over a transmit band;
    at least one filter configured to filter an output signal of the power amplifier;
    a first tunable matching network configured to couple to the power amplifier and to the at least one filter; and
    a control component configured to detect a present set of operating conditions of the power amplifier when the power amplifier operates in the ET mode of operation, wherein the control component is further configured to transmit a control signal to the first tunable matching network in response to the detected present set of operating conditions, wherein the first tunable matching network is further configured to adjust an impedance of the first tunable matching network in response to the transmitted control signal to optimize one or more ET characteristics of the power amplifier based at least in part on the present set of operating conditions, wherein the transmit band comprises two or more sub-bands, wherein a first sub-band of the two or more sub-bands comprises the present frequency, and wherein the one or more ET characteristics are optimized over the first sub-band, and wherein the transmit band is divided into the two or more sub-bands based at least in part on a frequency response of an input impedance of the at least one filter.

11. The system of claim 10, wherein the present set of operating conditions comprises a present frequency of operation.

12. The system of claim 10, wherein the one or more ET characteristics comprise at least one of an ET delay variation over frequency or a gain variation over frequency.

13. The system of claim 10, wherein the one or more ET characteristics comprise a clouding of at least one of an amplitude-to-amplitude distortion (AMAM) or an amplitude-to-phase distortion (AMPM).

14. The system of claim 10, further comprising a second tunable matching network configured to couple the at least one filter with an antenna port that is configured to couple to an antenna, wherein the second tunable matching network is further configured to minimize an impedance mismatch between the at least one filter and the antenna when the antenna is coupled to the antenna port.

15. The system of claim 10, further comprising:
a feedback receiver configured to receive a radio frequency (RF) transmit signal output via the at least one filter; and
an ET analysis component configured to determine at least one of the one or more ET characteristics based at least in part on an analysis of the RF transmit signal.

16. The system of claim 15, wherein the ET analysis component is configured to determine the at least one of the one or more ET characteristics based at least in part on one or more test signals.

17. The system of claim 15, wherein the ET analysis component is configured to determine the at least one of the one or more ET characteristics during a power-up sequence.

18. A non-transitory machine readable medium comprising instructions that, when executed, cause a User Equipment (UE) to:
determining a first state of a tunable matching network coupled to a power amplifier that is configured to operate within a transmit band in an envelope tracking (ET) mode of operation, wherein the first state optimizes one or more ET characteristics at a first set of operating conditions of the power amplifier; and
determining a second state of the tunable matching network coupled to the power amplifier that is configured to operate within the transmit band in the ET mode of operation, wherein the second state optimizes the one or more ET characteristics at a second set of operating conditions of the power amplifier,
wherein the transmit band comprises two or more sub-bands, wherein the first set of operating conditions comprises operation of the power amplifier within a first sub-band of the two or more sub-bands, and wherein the second set of operating conditions comprises operation of the power amplifier within a second sub-band of the two or more sub-bands.

19. The machine readable medium of claim 18, further comprising determining a first center frequency of the first sub-band, a second center frequency of the second sub-band, a first size of the first sub-band, and a second size of the second sub-band, wherein the one or more ET characteristics comprise an ET delay variation over frequency, and wherein the first center frequency, second center frequency, first size, and second size are determined based at least in part on a frequency response of the ET delay over the transmit band.

20. The machine readable medium of claim 18, wherein the first state minimizes a variance of at least one of the one or more ET characteristics within the first sub-band, and wherein the second state minimizes the variance of the at least one of the one or more ET characteristics within the second sub-band.

* * * * *